(12) United States Patent
Park et al.

(10) Patent No.: US 7,749,834 B2
(45) Date of Patent: Jul. 6, 2010

(54) METHOD OF FABRICATING SEMICONDUCTOR DEVICES HAVING BURIED CONTACT PLUGS

(75) Inventors: Je-Min Park, Gyeonggi-do (KR); Yoo-Sang Hwang, Gyeonggi-do (KR); Seok-Soon Song, Gyeonggi-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 827 days.

(21) Appl. No.: 11/364,635

(22) Filed: Feb. 27, 2006

(65) Prior Publication Data

US 2006/0205141 A1    Sep. 14, 2006

(30) Foreign Application Priority Data

Mar. 11, 2005 (KR) .................. 10-2005-0020728

(51) Int. Cl.
*H01L 21/8242* (2006.01)
(52) U.S. Cl. ............... 438/239; 438/399; 257/E21.648; 257/E21.658
(58) Field of Classification Search ............... 438/239, 438/253, 694, 241, 250, 244, 393, 387, 396, 438/399; 257/E21.649, 310, E21.019, E21.013, 257/E21.648, E21.658; 365/225
See application file for complete search history.

(56) References Cited

U.S. PATENT DOCUMENTS

| | | | |
|---|---|---|---|
| 5,714,779 A * | 2/1998 | Auer et al. .................. 257/306 |
| 6,136,643 A | 10/2000 | Jeng et al. | |
| 6,420,227 B1 * | 7/2002 | Yoshida et al. .............. 438/241 |
| 6,423,591 B2 * | 7/2002 | Nakamura ................... 438/238 |
| 6,507,064 B1 * | 1/2003 | Tang et al. .................. 257/306 |
| 6,589,837 B1 * | 7/2003 | Ban et al. .................... 438/239 |

(Continued)

FOREIGN PATENT DOCUMENTS

| | | |
|---|---|---|
| JP | 11-054703 | 2/1999 |
| KR | 2002-0061942 | 7/2002 |
| KR | 2004-0063351 | 7/2004 |

OTHER PUBLICATIONS

English language abstract of Korean Publication No. 2002-0061942.
English language abstract of Korean Publication No. 2004-0063351.
English language abstract of Japanese Publication No. 11-054703.

*Primary Examiner*—W. David Coleman
*Assistant Examiner*—Latanya Crawford
(74) *Attorney, Agent, or Firm*—F. Chau & Associates, LLC

(57) ABSTRACT

A method includes forming a lower dielectric layer on a semiconductor substrate, forming a bit line landing pad and a storage landing pad that penetrate the lower dielectric layer, covering the lower dielectric layer, the bit line landing pad, and the storage landing pad with an intermediate dielectric layer, forming an upper dielectric layer on the intermediate dielectric layer, partially removing the upper dielectric layer and the intermediate dielectric layer to form a contact opening that exposes the storage landing pad and a portion of the lower dielectric layer, forming a contact spacer on an inner wall of the contact opening, and filling the contact opening with a contact plug, a top surface of the contact plug larger than a surface of the contact plug that is in contact with the storage landing pad, the top surface of the contact plug eccentric in relation to the storage landing pad.

24 Claims, 28 Drawing Sheets

U.S. PATENT DOCUMENTS

| | | | |
|---|---|---|---|
| 6,656,786 B2 * | 12/2003 | Chiang et al. | 438/241 |
| 6,696,336 B2 * | 2/2004 | DeBoer et al. | 438/253 |
| 6,777,341 B2 * | 8/2004 | Shin et al. | 438/704 |
| 7,045,411 B1 * | 5/2006 | Lee | 438/218 |
| 7,476,924 B2 * | 1/2009 | Park et al. | 257/308 |
| 2001/0041404 A1 * | 11/2001 | Uchiyama | 438/253 |
| 2002/0005542 A1 * | 1/2002 | Hayano et al. | 257/306 |
| 2002/0024084 A1 * | 2/2002 | Coursey | 257/306 |
| 2002/0135004 A1 * | 9/2002 | Uh et al. | 257/296 |
| 2003/0015743 A1 * | 1/2003 | Ogawa et al. | 257/296 |
| 2004/0178433 A1 * | 9/2004 | Yun et al. | 257/298 |
| 2004/0185657 A1 * | 9/2004 | Lee et al. | 438/643 |
| 2004/0266101 A1 * | 12/2004 | Park et al. | 438/253 |
| 2005/0003646 A1 * | 1/2005 | Park et al. | 438/586 |
| 2005/0186733 A1 * | 8/2005 | Yun et al. | 438/254 |
| 2005/0218440 A1 * | 10/2005 | Park | 257/298 |
| 2005/0280035 A1 * | 12/2005 | Lee et al. | 257/208 |
| 2006/0197162 A1 * | 9/2006 | Kim et al. | 257/382 |

\* cited by examiner

METHOD OF FABRICATING SEMICONDUCTOR DEVICES HAVING BURIED CONTACT PLUGS

CROSS-REFERENCE TO RELATED APPLICATIONS

This application claims priority from Korean Patent Application No. 10-2005-0020728, filed on 11 Mar. 2005. Korean Patent Application No. 10-2005-0020728 is incorporated by reference in its entirety.

BACKGROUND

1. Technical Field

This disclosure relates to a method of fabricating a semiconductor device, and more particularly, to a method of fabricating a semiconductor device having a buried contact plug.

2. Description of the Related Art

As electronic products become thinner and smaller, research is actively conducted on high integration technology for semiconductor devices used in electronic products. The high integration technology includes technology for reducing components of the semiconductor devices and technology for effectively arranging components of the semiconductor devices.

For example, a semiconductor memory device such as a dynamic random access memory (DRAM) includes a plurality of memory cells. The memory cell has a cell transistor, a cell capacitor, and an interconnection. A structure having an area of $8F^2$ is widely employed for the memory cell. In addition, technology for arranging the area of the memory cell to $6F^2$ or $4F^2$ is widely researched. In this case, F denotes the minimum feature size. Accordingly, technology for connecting the cell transistor to the cell capacitor is faced with several difficulties.

FIGS. 1 and 2 are cross-sectional views illustrating a method of fabricating a conventional DRAM. Specifically, FIG. 1 is a cross-sectional view taken along the direction crossing a word line, and FIG. 2 is a cross-sectional view taken along the direction crossing a bit line.

Referring to FIGS. 1 and 2, an isolation layer 3 is formed to define active regions 2 in a predetermined region of a semiconductor substrate 1. Gate dielectric layers 5 are formed on the active regions 2. Gate electrodes 7 and passivation layer patterns 9 are formed on the gate dielectric layers 5 which cross the active regions 2 and are sequentially stacked. The gate electrodes 7 extend to act as a word line. Spacers 11 are formed on sidewalls of the gate electrodes 7. A lower inter-level dielectric layer 13 is formed on the entire surface of the semiconductor substrate 1 having the gate electrodes 7. Storage landing pads 15 and bit line landing pads 16 are formed through the lower inter-level dielectric layer 13 to contact the active regions 2. An intermediate inter-level dielectric layer 23 is formed on the semiconductor substrate 1 having the storage landing pads 15 and the bit line landing pads 16. Bit line plugs 19 in contact with the bit line landing pads 16, and bit lines 21 crossing over the bit line plugs 19 are formed within the intermediate inter-level dielectric layer 23. The bit lines 21 are electrically connected to the active regions 2 via the bit line plugs 19 and the bit line landing pads 16. In addition, buried contact plugs 25 in contact with the storage landing pads 15 are formed within the intermediate inter-level dielectric layer 23. Top surfaces of the buried contact plugs 25 are exposed. Intermediate pads 27 are formed on the buried contact plugs 25. An upper inter-level dielectric layer 29 is formed on the semiconductor substrate 1 having the intermediate pads 27. Top surfaces of the intermediate pads 27 are exposed. Storage nodes 31, a capacitor dielectric layer 33, and a plate node 35 are sequentially stacked on the exposed intermediate pads 27. In this case, the storage node 31 acts as a lower electrode of a capacitor, and the plate node 35 acts as an upper electrode of the capacitor. In addition, the storage node 31 is electrically connected to the active region 2 via the intermediate pad 27, the buried contact plug 25, and the storage landing pad 15.

To achieve high integration, it is advantageous that the storage nodes 31 are regularly arranged with a predetermined size. However, the buried contact plugs 25 must be in contact with the storage landing pads 15 to avoid contact with the bit lines 21 and the bit line landing pads 16. In addition, the buried contact plug 25 must be formed to avoid contact with adjacent other storage landing pads 15. It is very difficult to regularly arrange the buried contact plugs 25 in this manner. Consequently, an arrangement margin for the storage nodes 31 must be secured using the intermediate pads 27. In this case, an additional process of forming the intermediate pads 27 is required. In addition, an area loss occurs due to the arrangement margin of the intermediate pads 27.

U.S. Pat. No. 6,136,643 to Jeng, et al. ("Jeng") is directed at Method for Fabricating Capacitor-Over-Bit-Line Dynamic Random Access Memory using self-aligned contact etching technology.

According to Jeng, the method includes forming a DRAM cell having capacitors of a COB structure along with active regions, gate patterns, and bit line patterns. An etch stopper is formed to cover gate electrodes, sidewall spacers, and source and drain regions. Self-aligned openings are formed to expose the source and drain regions through a first oxide layer. Polysilicon landing plugs are formed to fill the self-aligned openings. A second oxide layer is formed and then a bit line contact hole is formed. A polycide layer and a capping layer are sequentially stacked and patterned to form a bit line. A third etch stopper is formed, and a third oxide layer is formed. A capacitor node opening is formed through the third oxide layer. A capacitor lower electrode, a capacitor dielectric layer, and a capacitor upper electrode are formed. The third etch stopper acts to prevent the third oxide layer from being over-etched while the capacitor node opening is formed. Nevertheless, consistent efforts are required to prevent the contact plug from being electrically connected to its adjacent conductive patterns.

Embodiments of the invention address these and other disadvantages of the conventional art.

SUMMARY

Embodiments of the invention provide methods of fabricating a contact plug of a semiconductor device capable of preventing the contact plug from being electrically connected to adjacent conductive patterns while omitting a process of forming intermediate pads.

BRIEF DESCRIPTION OF THE DRAWINGS

The foregoing and other objects, features and advantages of the invention will be apparent from the following written description of exemplary embodiments and the accompanying drawings listed below. The drawings are not necessarily to scale; rather, emphasis is placed upon illustrating the inventive principles that exist in one or more embodiments of the invention.

DETAILED DESCRIPTION

Figure 1:
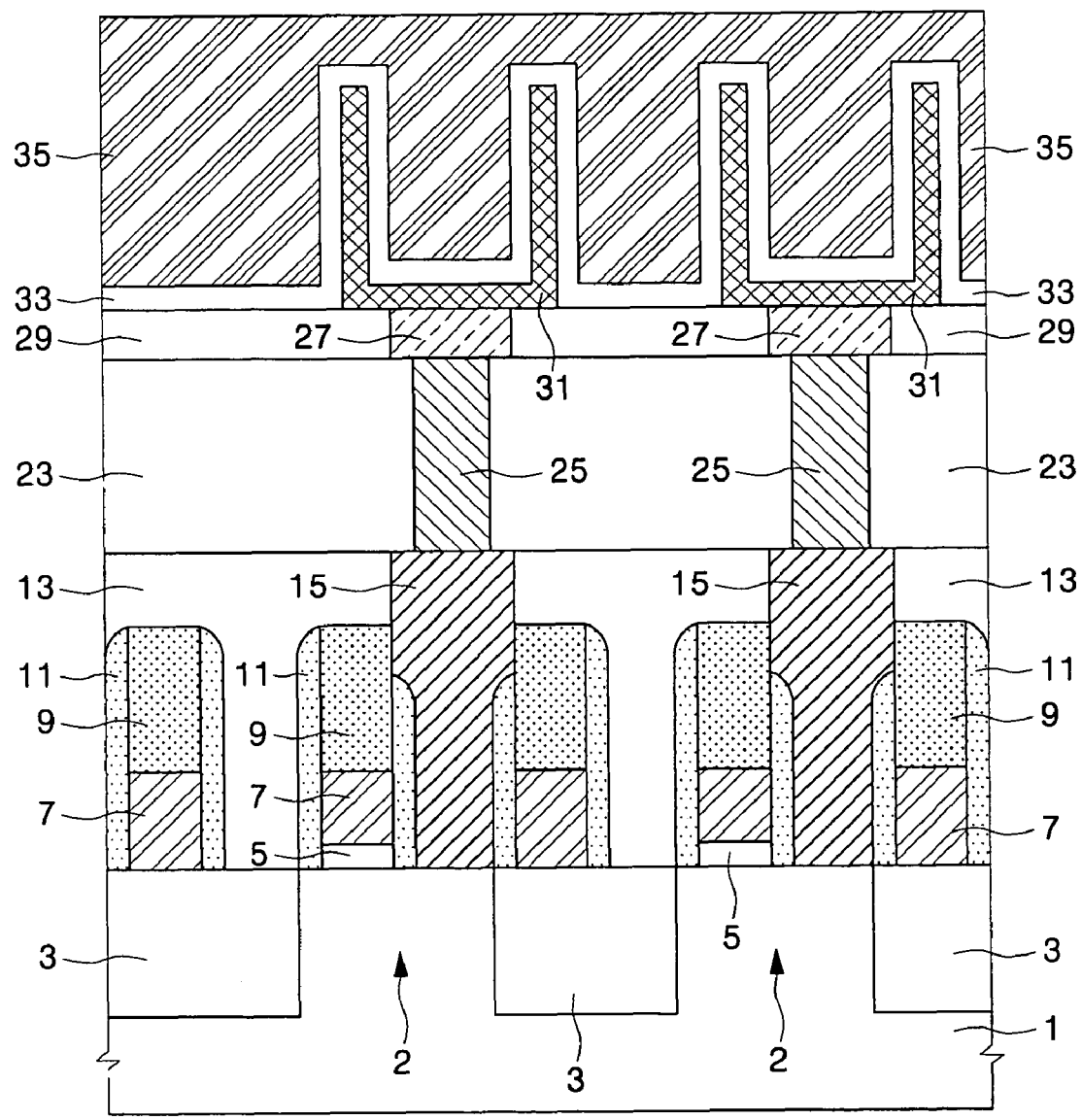
FIGS. 1 and 2 are cross-sectional views illustrating a method of fabricating a conventional DRAM.
Figure 2:
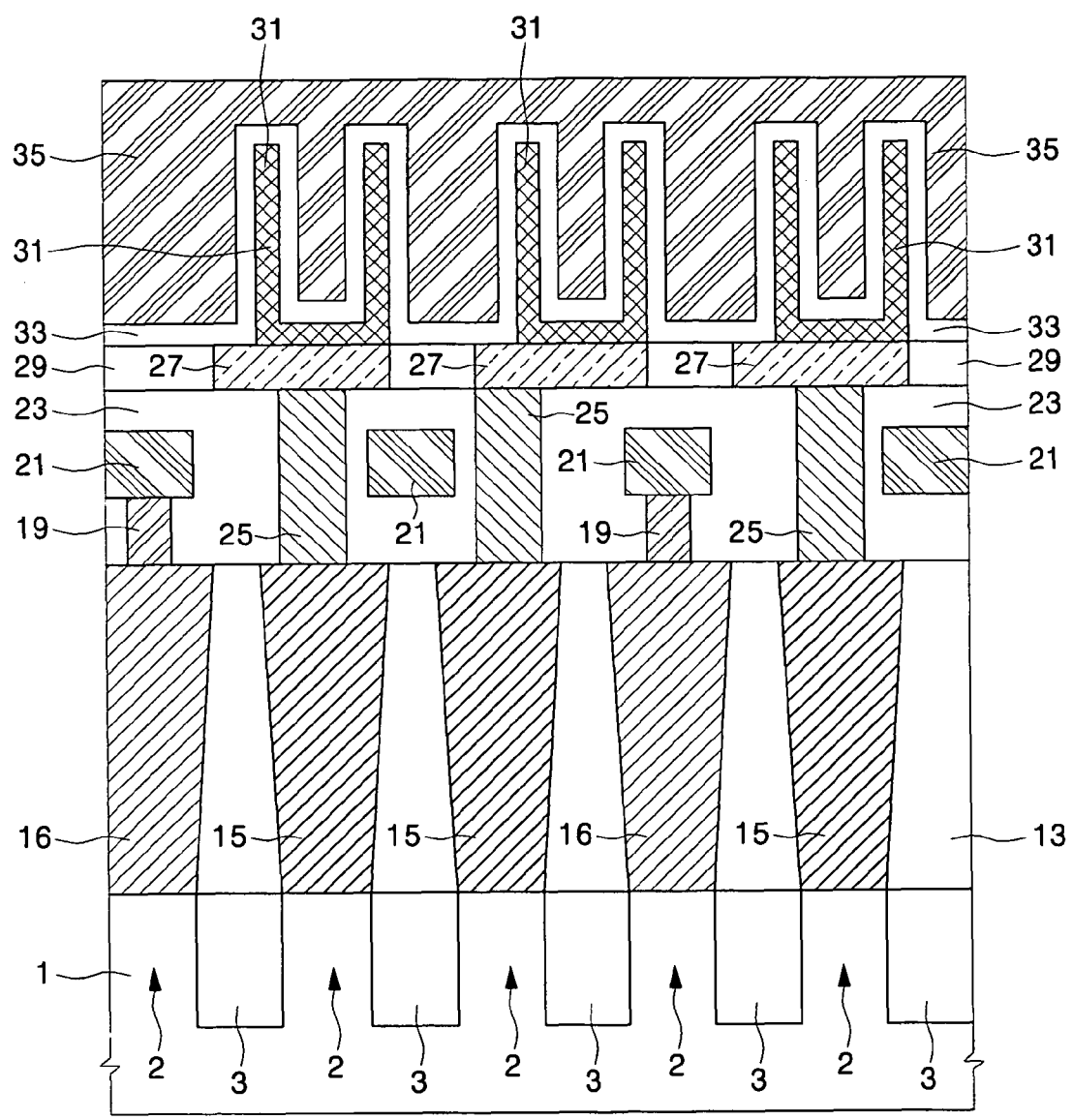

Exemplary embodiments of the invention are described in detail in the following written description with reference to the accompanying drawings. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. In addition, when a layer is described as being formed on another layer or on a substrate, it means that the layer may be formed directly on the other layer or substrate, or that a third layer may be interposed between the layer and the other layer or substrate. Like numbers refer to like elements throughout the specification.

FIGS. 3 to 17 are cross-sectional views and plan views illustrating a method of fabricating a DRAM in accordance with some exemplary embodiments of the invention.

Figure 3:
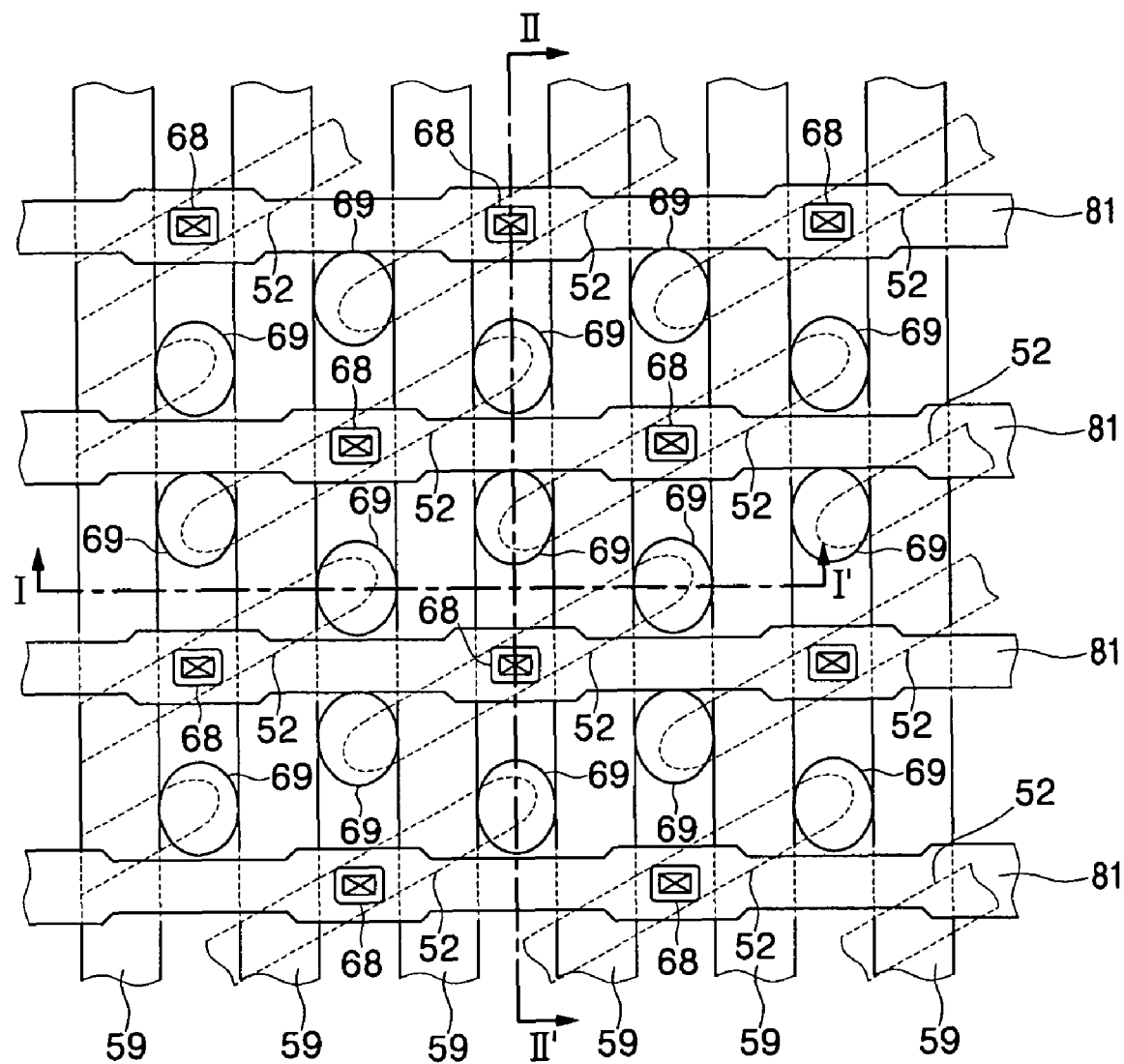
FIGS. 3 to 17 are cross-sectional views and plan views illustrating a method of fabricating a DRAM in accordance with some exemplary embodiments of the invention.
Figure 4:
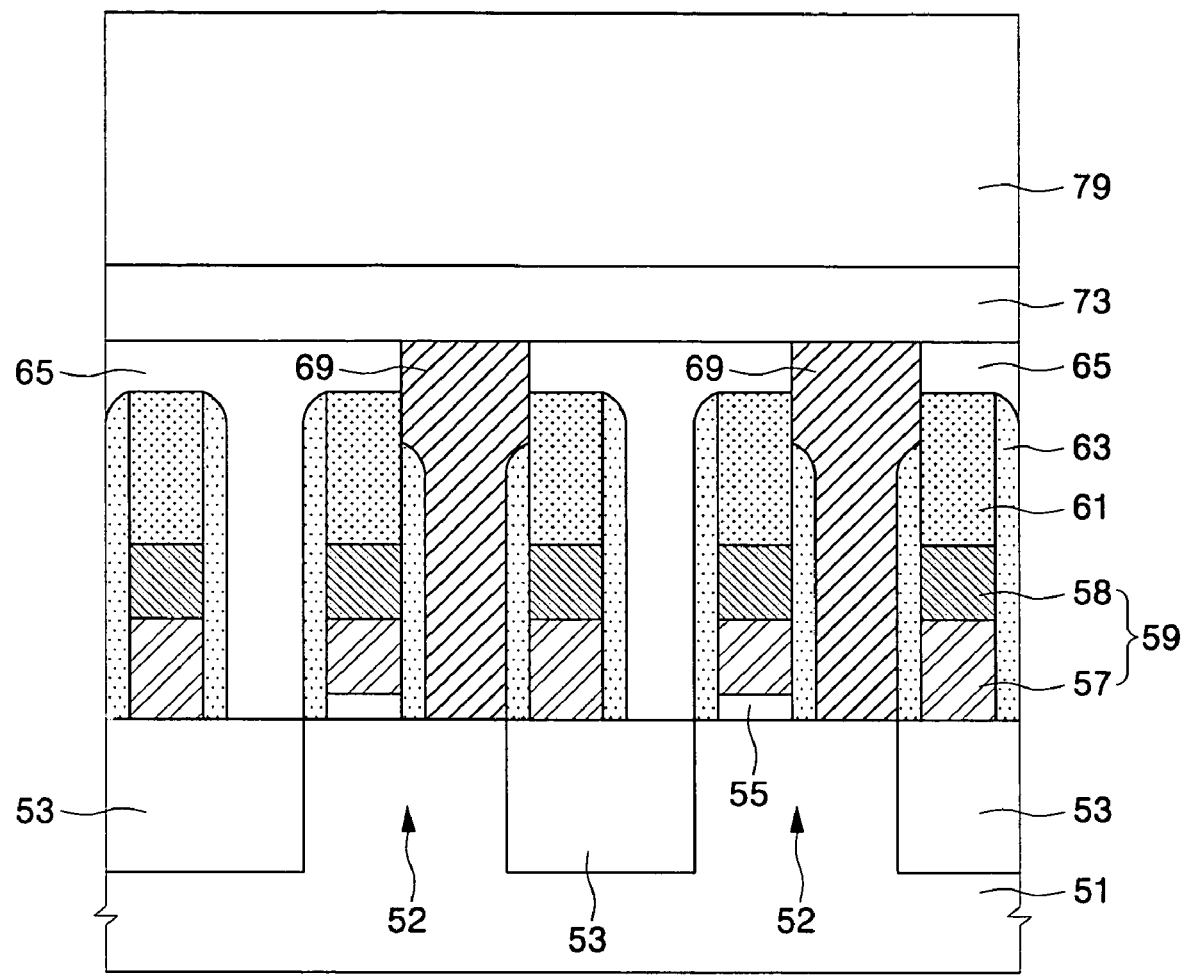
Figure 5:
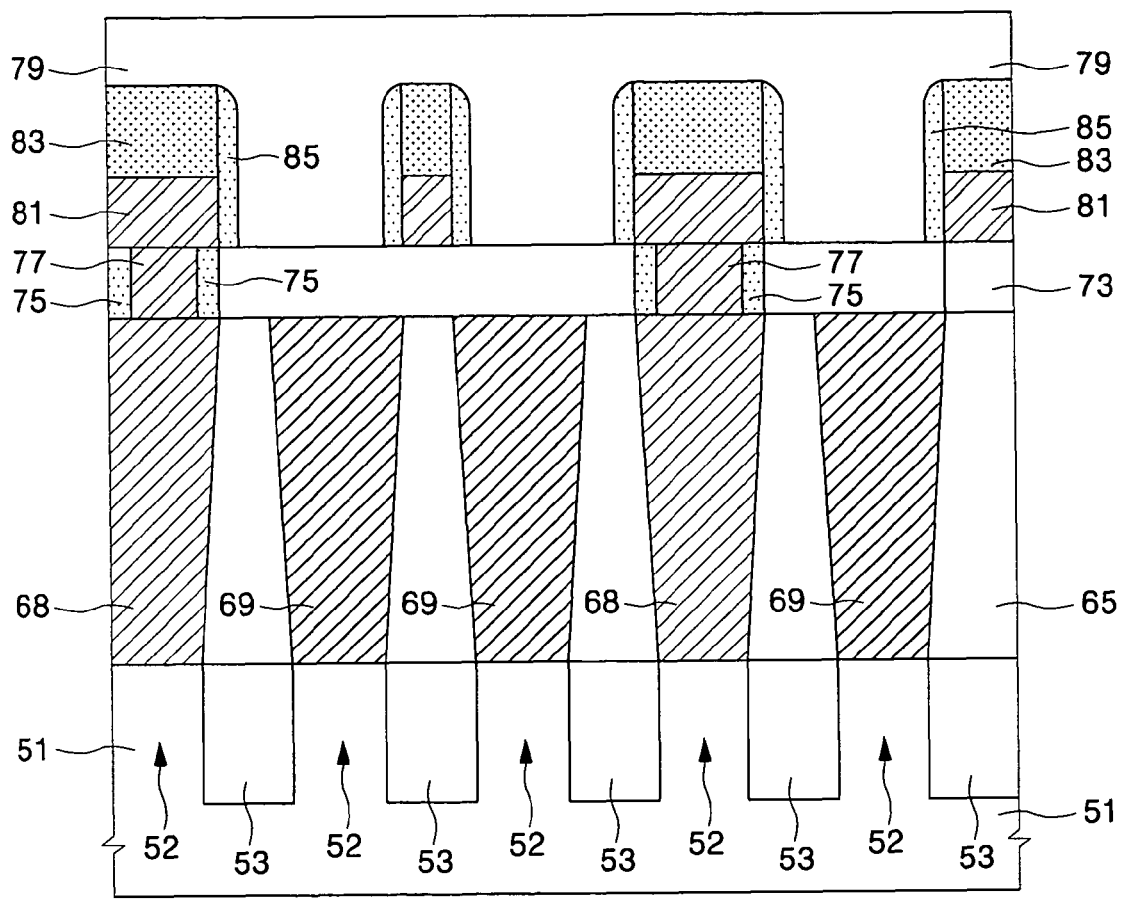

Specifically, FIG. 3 is a plan view illustrating the formation of landing pads and bit lines in accordance with some exemplary embodiments of the invention, FIG. 4 is a cross-sectional view taken along line I-I' of FIG. 3, and FIG. 5 is a cross-sectional view taken along line II-II' of FIG. 3.

Figure 6:
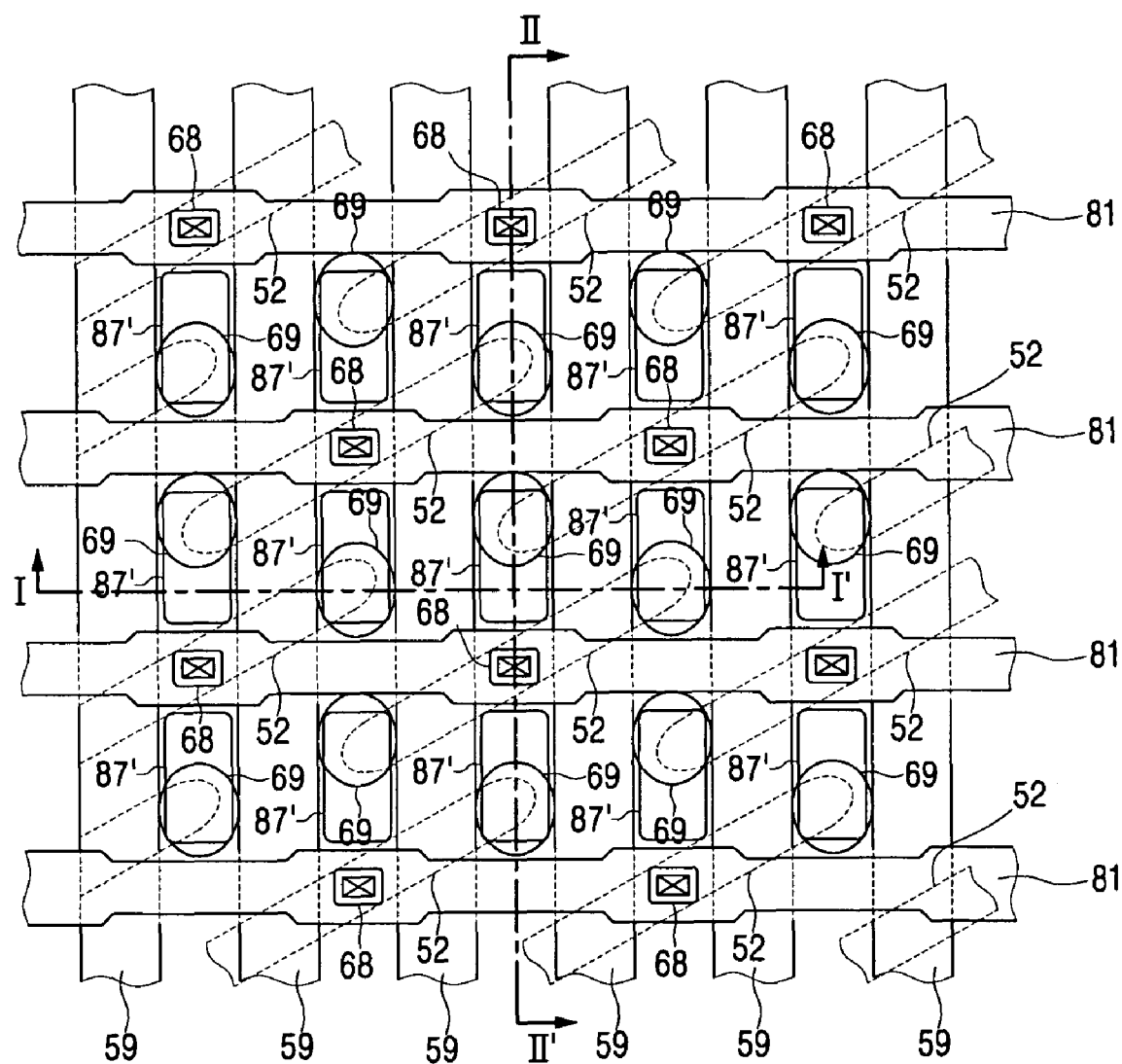
Figure 7:
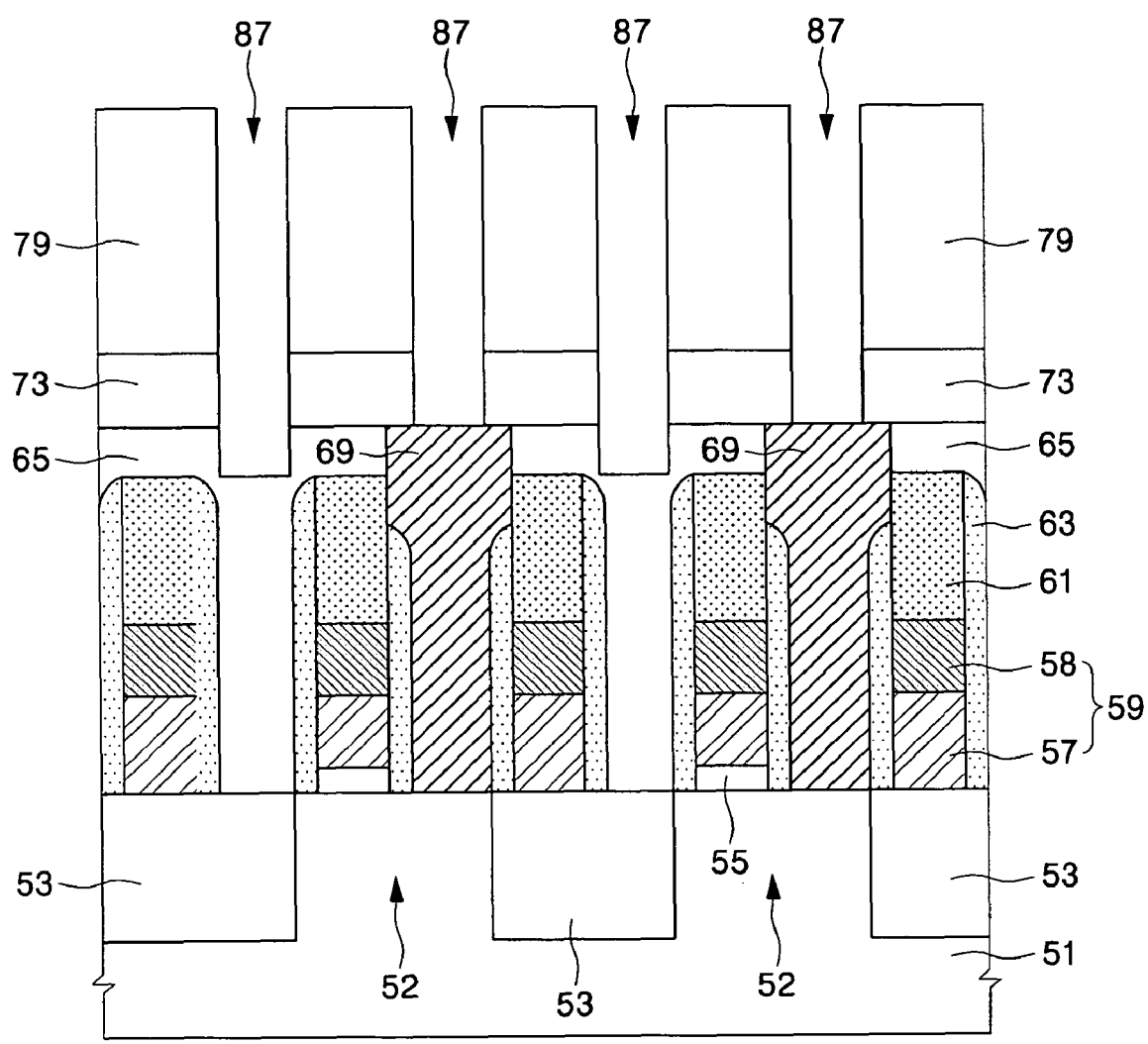
Figure 8:
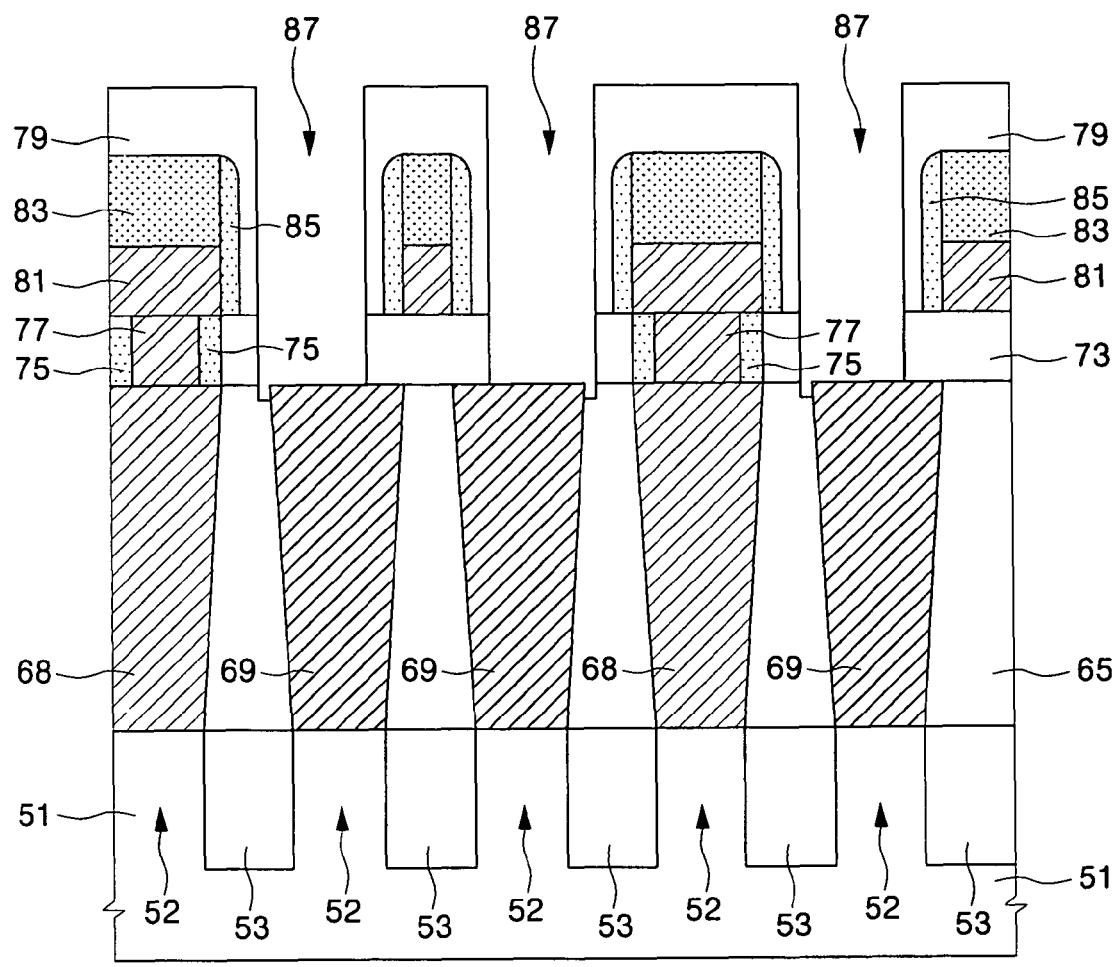
Figure 9:
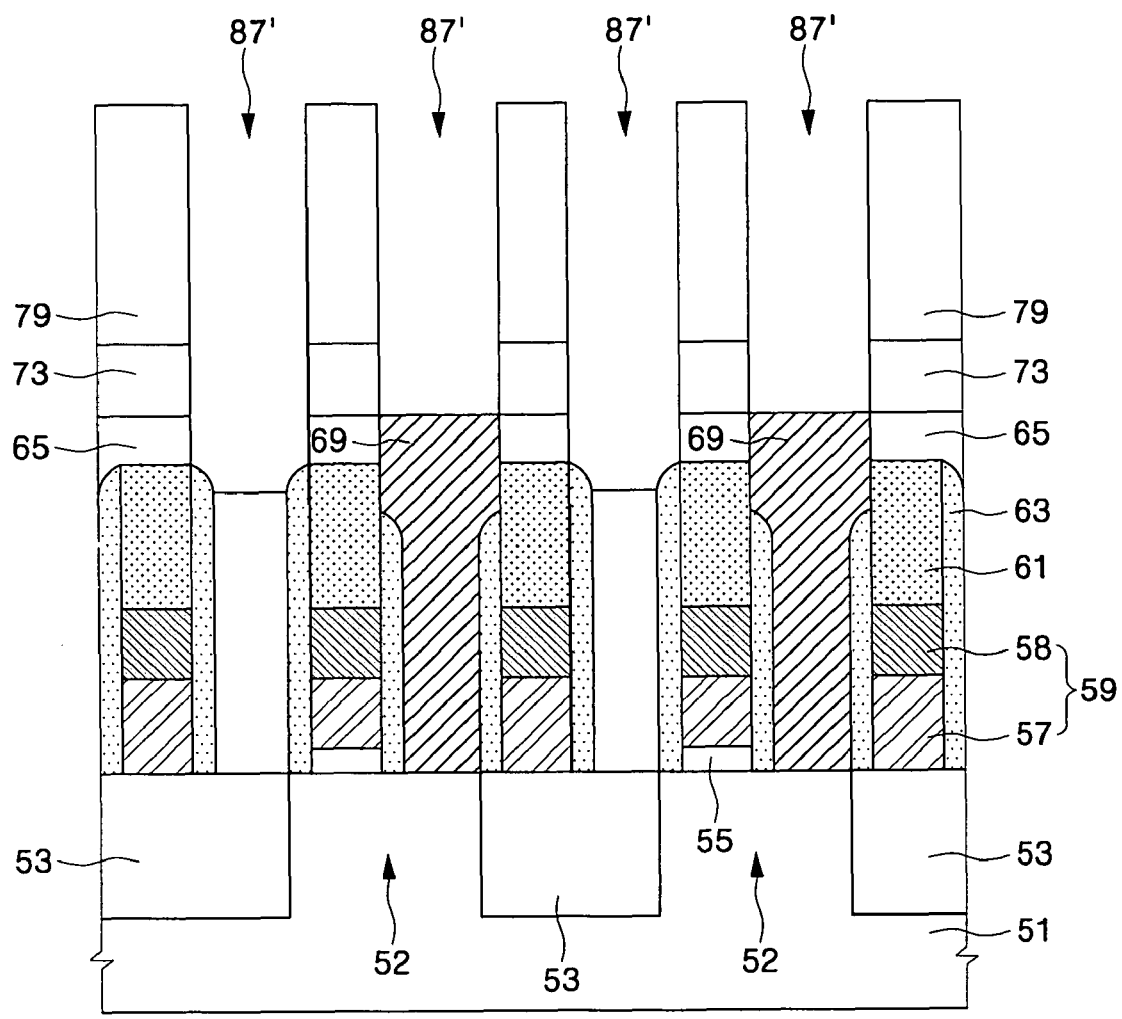
Figure 10:
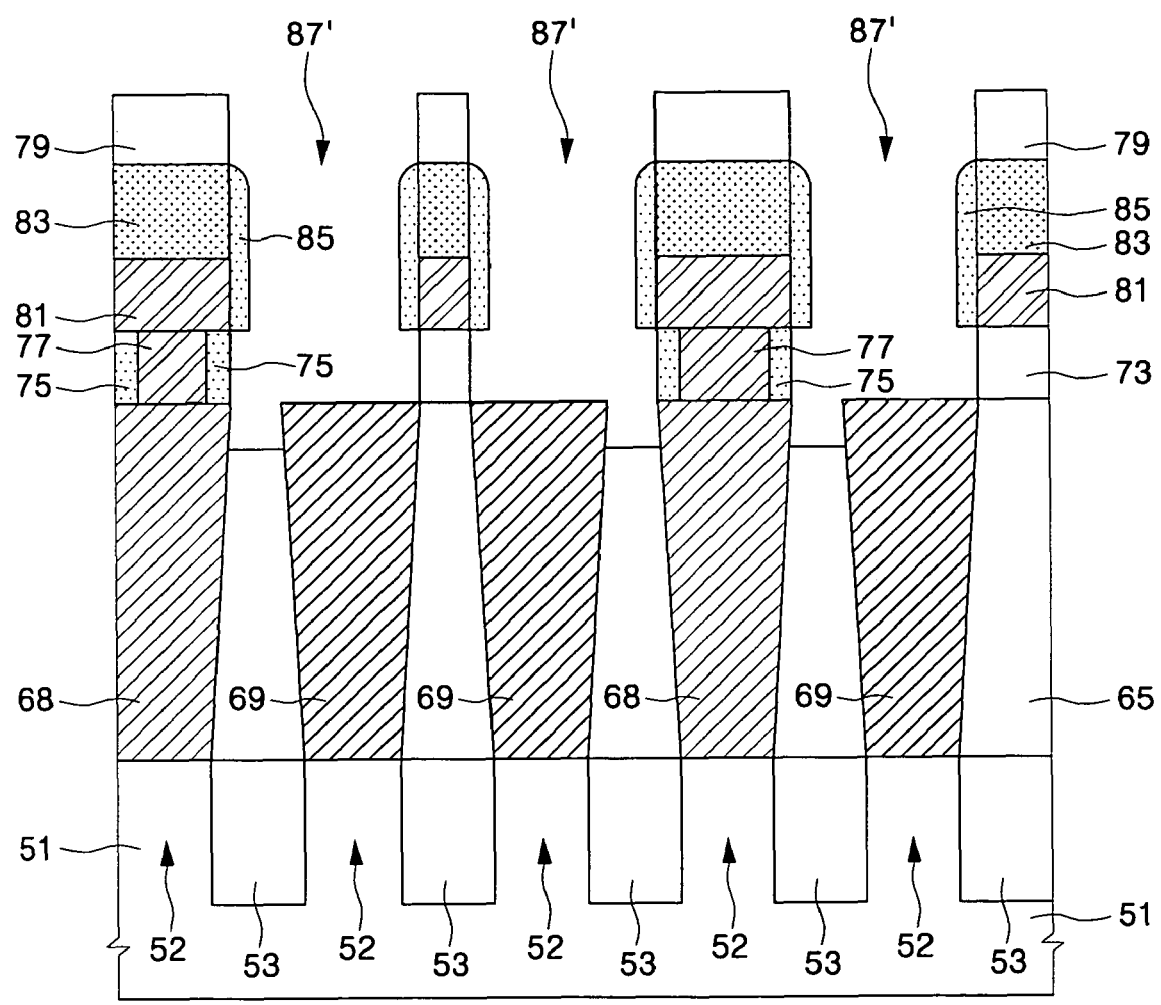
Figure 11:
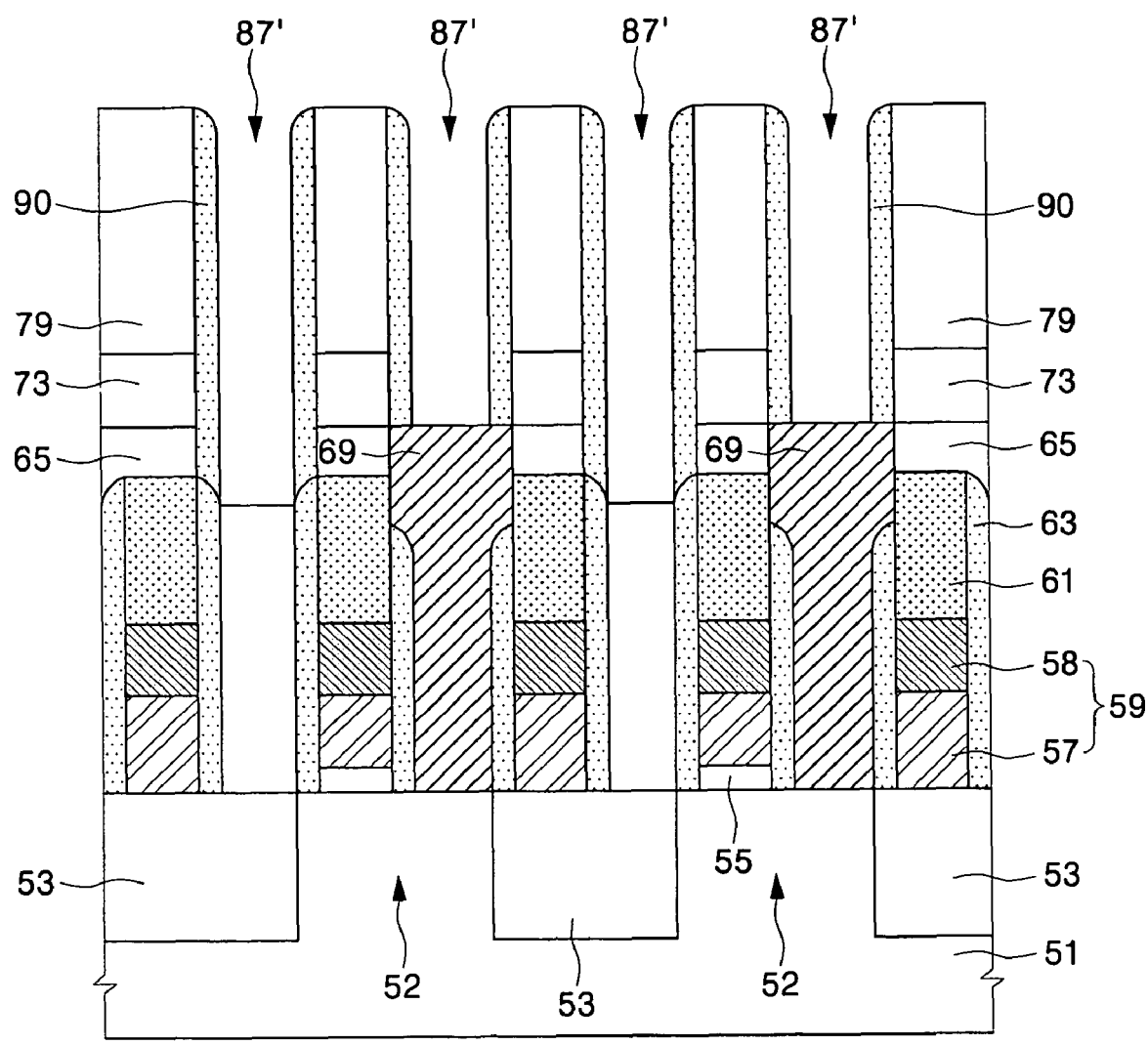

FIG. 6 is a plan view illustrating formation of a buried contact opening in accordance with some exemplary embodiments of the invention, FIGS. 7, 9 and 11 are cross-sectional views taken along line I-I' of FIG. 6, and FIGS. 8, 10 and 12 are cross-sectional views taken along line II-II' of FIG. 6.

Figure 13:
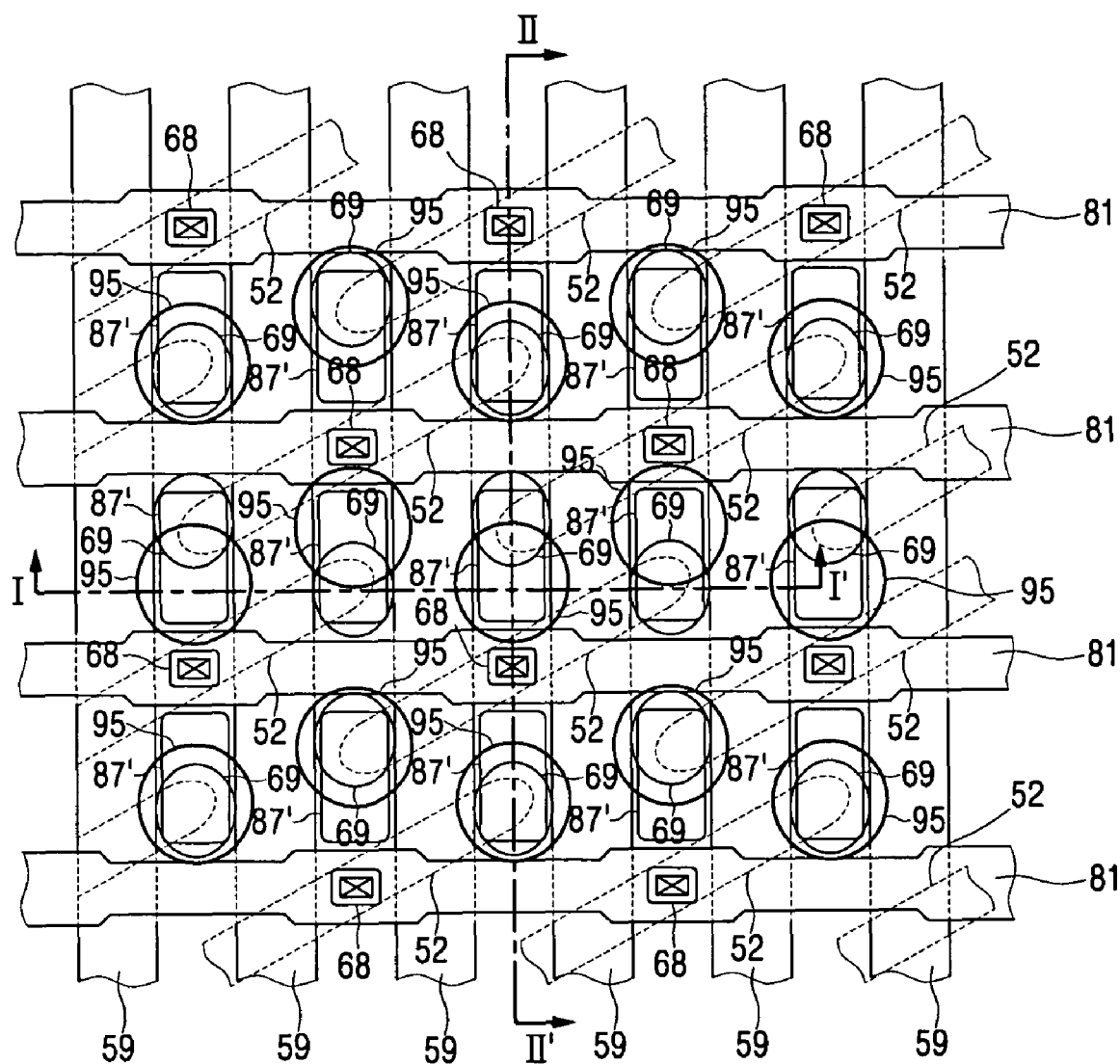
Figure 14:
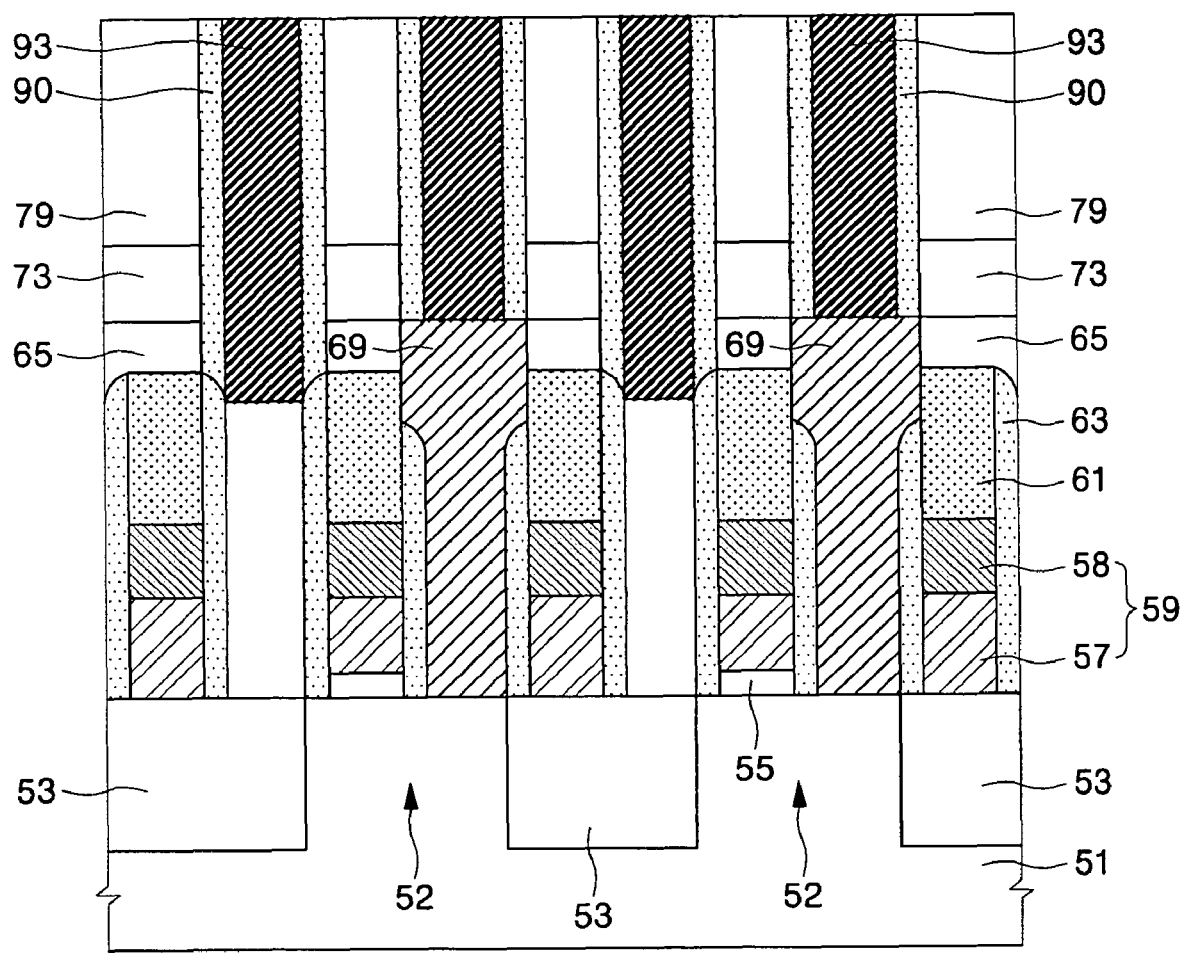
Figure 15:
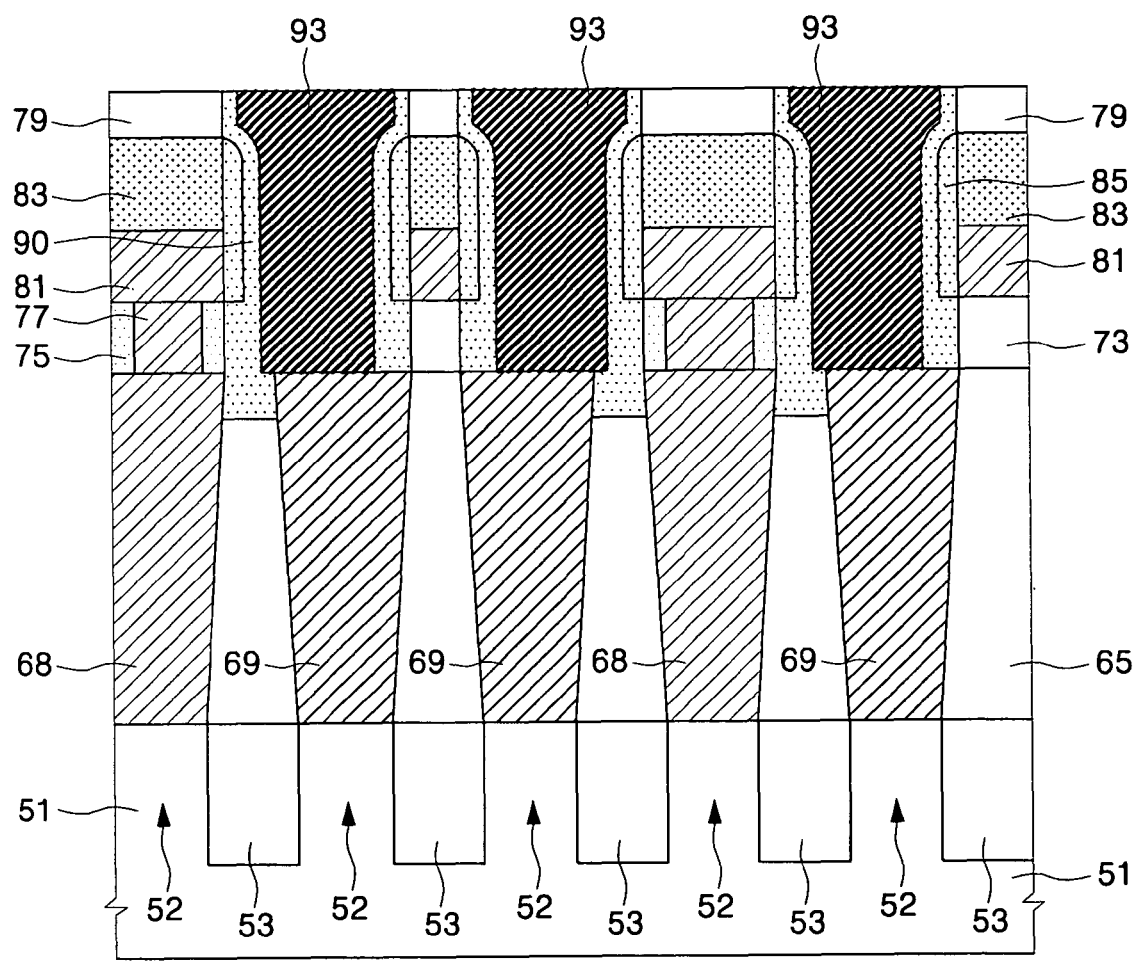
Figure 16:
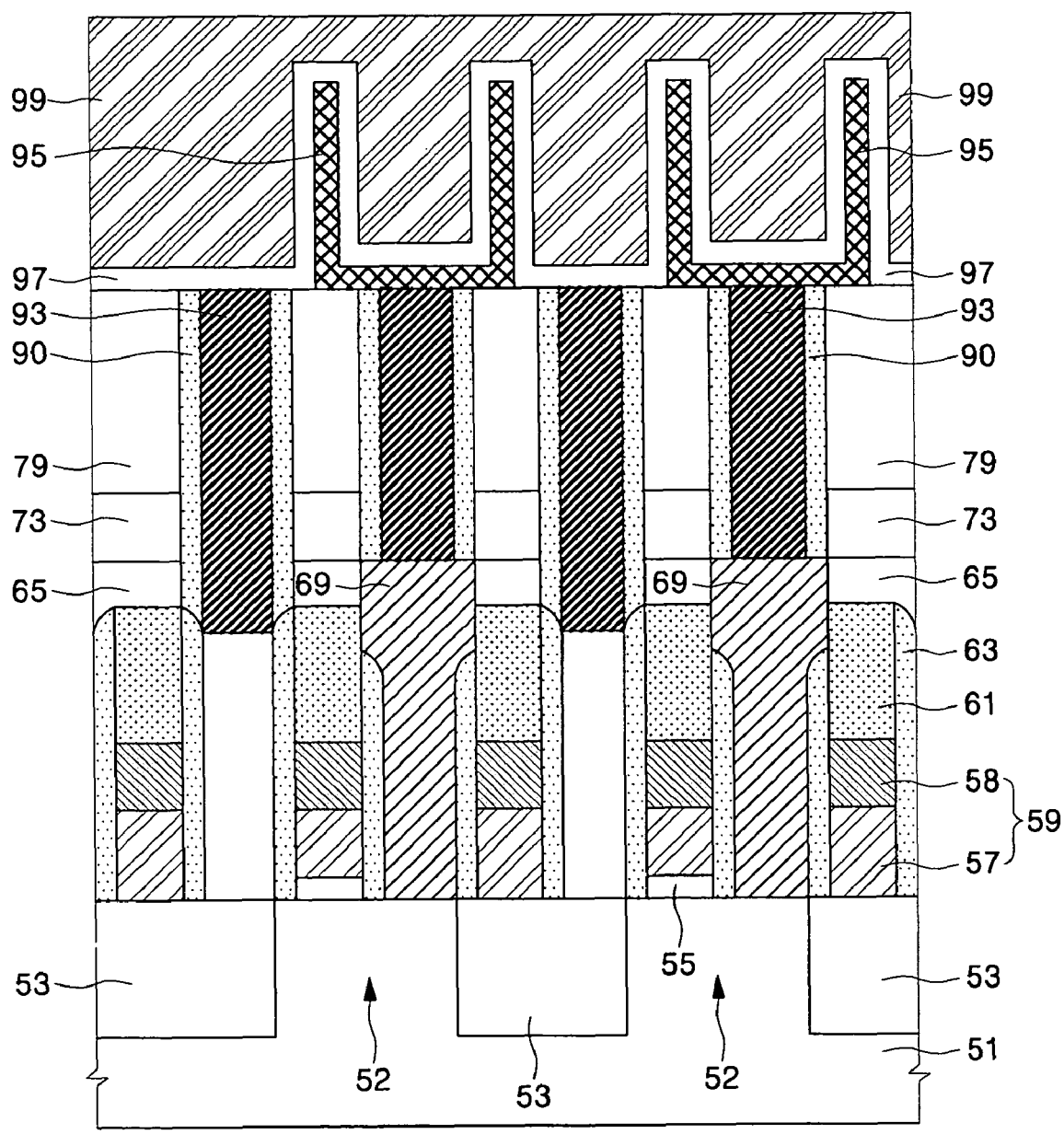
Figure 17:
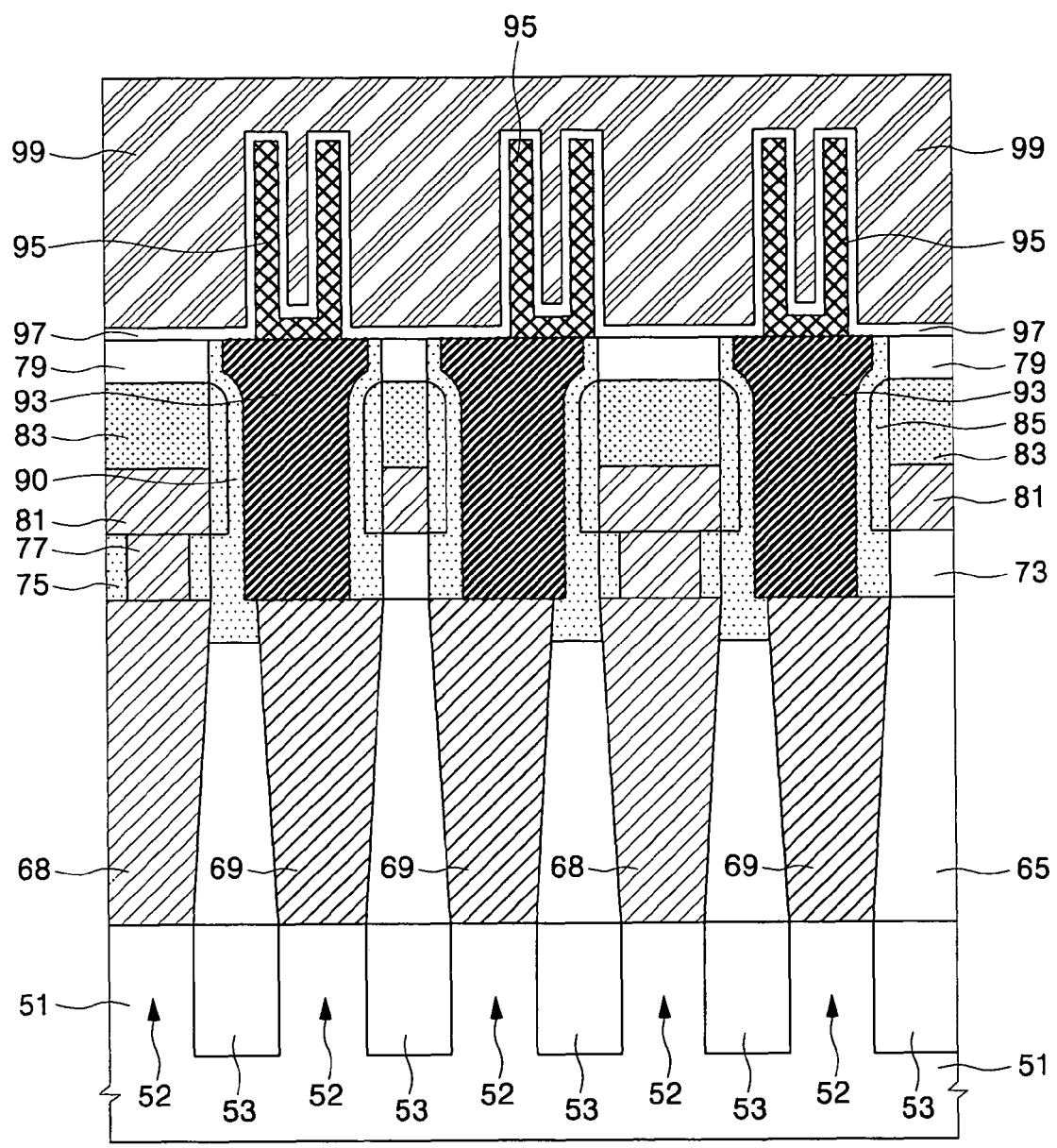

FIG. 13 is a plan view illustrating formation of a buried contact plug in accordance with some exemplary embodiments of the invention, FIGS. 14 and 16 are cross-sectional views taken along line I-I' of FIG. 13, and FIGS. 15 and 17 are cross-sectional views taken along line II-II' of FIG. 13.

Referring to FIGS. 3, 4 and 5, an isolation layer 53 is formed in a predetermined region of a semiconductor substrate 51. The isolation layer 53 defines active regions 52. The active regions 52 may be formed in a bar shape as shown in FIG. 3 and may be misaligned with each other. The isolation layer 53 may be formed of an insulating layer which fills a trench region formed within the semiconductor substrate 51, e.g., a high density plasma (HDP) oxide layer.

Word lines 59 that are parallel to one another are formed to cross over the active regions 52. Specifically, a gate dielectric layer 55, a lower gate conductive layer, an upper gate conductive layer, and a hard mask layer are sequentially stacked on the semiconductor substrate 51 having the isolation layer 53. The gate dielectric layer 55 may be formed of a silicon oxide layer by a thermal oxidation method. The lower gate conductive layer may be formed of a polysilicon layer. The upper gate conductive layer may be formed of a metal silicide layer such as a tungsten silicide (WSi) layer. The hard mask layer may be formed of a silicon nitride layer (SiN) or a silicon oxynitride layer (SiON). The hard mask layer, the upper gate conductive layer, and the lower gate conductive layer are continuously patterned to form a hard mask pattern 61, an upper gate conductive pattern 58, and a lower gate conductive pattern 57, respectively. The lower gate conductive pattern 57 and the upper gate conductive pattern 58 sequentially stacked act as a gate electrode 59. In addition, the gate electrode 59 extends to form the word line 59.

As shown in FIG. 3, a technique of forming two cell transistors on one active region 52 is employed. That is, two gate electrodes 59 may be formed on the active region 52. The word lines 59 may be parallel to one another when seen from the plan view. In this case, the word lines 59 may also cross over the isolation layer 53.

Subsequently, a conformal spacer insulating layer may be formed on a surface of the semiconductor substrate 51. The spacer insulating layer may be formed of SiN by a chemical vapor deposition (CVD) method. The spacer insulating layer may be anisotropically etched to form insulating spacers 63 which cover sidewalls of the hard mask pattern 61 and the gate electrode 59.

A lower inter-level dielectric layer 65 is formed on the semiconductor substrate 51 having the gate electrodes 59. The lower inter-level dielectric layer 65 may be formed of an insulating layer such as a silicon oxide layer. In addition, a top surface of the lower inter-level dielectric layer 65 is preferably planarized.

The lower inter-level dielectric layer 65 is patterned to form landing pad openings which expose the active regions 52. A landing pad conductive layer is formed which completely fills the landing pad openings and covers the lower inter-level dielectric layer 65. The landing pad conductive layer may be formed of a polysilicon layer or a metal layer. When the landing pad conductive layer is formed of the metal layer, the landing pad conductive layer may be formed of a tungsten layer (W). The landing pad conductive layer is planarized to form bit line landing pads 68 and storage landing pads 69. The process of planarizing the landing pad conductive layer may employ a chemical mechanical polishing (CMP) process using the lower inter-level dielectric layer 65 as a stopper.

As shown in FIG. 3, two word lines 59 may be formed on one active region 52. In this case, the bit line landing pad 68 may be formed on the active region 52 between the word lines 59, and the storage landing pads 69 may be formed on the active regions 52 opposite to the word lines 59 with the bit line landing pad 68 being interposed therebetween. That is, the bit line landing pads 68 may penetrate the lower inter-level dielectric layer 65 to be electrically connected to the active regions 52 between the word lines 59, and the storage landing pads 69 may penetrate the lower inter-level dielectric layer 65 to be electrically connected to the active regions 52 opposite to the word lines 59 in the bit line landing pad 68. In addition, the lower inter-level dielectric layer 65, the bit line landing pads 68, and the storage landing pads 69 may be exposed on the substantially same plane.

An intermediate inter-level dielectric layer 73 is formed on the lower inter-level dielectric layer 65, the bit line landing pads 68, and the storage landing pads 69. The intermediate inter-level dielectric layer 73 may be formed of an insulating layer such as a silicon oxide layer. In addition, a top surface of the intermediate inter-level dielectric layer 73 is preferably planarized. The intermediate inter-level dielectric layer 73 is patterned to form bit line contact holes exposing the bit line landing pads 68. Bit line plug spacers 75 may be formed on inner walls of the bit line contact holes. The bit line plug spacers 75 are preferably formed of an insulating layer having an etch selectivity with respect to the intermediate inter-level dielectric layer 73. When the intermediate inter-level dielectric layer 73 is a silicon oxide layer, the bit line plug spacers 75 may be formed of a nitride layer such as a silicon nitride or silicon oxynitride layer. Alternatively, the bit line plug spacers 75 may be omitted. A bit line conductive layer and a capping layer are formed to completely fill the bit line contact holes and cover the intermediate inter-level dielectric layer 73. The bit line conductive layer may be formed of a polysilicon layer. In addition, the bit line conductive layer may be formed of a barrier metal layer and a metal layer which are sequentially stacked. The barrier metal layer may be formed of a titanium nitride layer, and the metal layer may be formed of a tungsten layer (W). In addition, the bit line conductive layer may be formed of the metal layer only. The capping layer may be formed of a nitride layer such as a silicon nitride or silicon oxynitride layer. The capping layer and the bit line conductive layer are patterned to form capping patterns 83 and bit lines 81 which cross the word lines 59. Consequently, the bit lines 81 can be electrically connected to the bit line landing pads 68 via bit line plugs 77 penetrating the intermediate inter-level dielectric layer 73. Bit line spacers 85 may be formed to cover sidewalls of the capping patterns 83 and the bit lines 81. An upper inter-level dielectric layer 79 is formed on the semiconductor substrate 51 having the bit lines 81. The upper inter-level dielectric layer 79 is preferably formed of an insulating layer having an etch selectivity with respect to the capping patterns 83. When the capping patterns 83 are formed of a nitride layer such as a silicon nitride or silicon oxynitride layer, the upper inter-level dielectric layer 79 may be formed of an insulating layer such as a silicon oxide layer. In addition, a top surface of the upper inter-level dielectric layer 79 is preferably planarized. The bit line spacers 85 are preferably formed of an insulating layer having an etch selectivity with respect to the upper inter-level dielectric layer 79. When the upper inter-level dielectric layer 79 is formed of a silicon oxide layer, the bit line spacers 85 may be formed of a nitride layer such as a silicon nitride or silicon oxynitride layer. Alternatively, the bit line spacers 85 may be omitted.

Referring to FIGS. 6, 7, and 8, the upper inter-level dielectric layer 79 and the intermediate inter-level dielectric layer 73 are sequentially patterned to form preliminary buried contact openings 87 partially exposing the storage landing pads 69. The preliminary buried contact openings 87 may be shaped as rectangles or ellipses which extend in a direction of adjacent bit lines 81 as shown in FIG. 6. While the intermediate inter-level dielectric layer 73 is patterned, the lower inter-level dielectric layer 65 may be partially etched to partially expose sidewalls of the storage landing pads 69.

Referring to FIGS. 6, 9 and 10, the preliminary buried contact openings 87 extend to form buried contact openings 87'. The buried contact openings 87' may be formed by, for example, an etching process using a wet etching solution. Consequently, the buried contact openings 87' may be formed between two adjacent bit lines 81, and may be shaped as a rectangle or ellipse when seen in the plan view, and may be eccentric to the storage landing pads 69. In this case, the buried contact openings 87' may be formed to expose all of partial regions of the storage landing pads 69, partial regions of the bit line landing pads 68, and sidewalls of the bit lines 81 facing each other. In addition, the bit line plugs 77 may be partially exposed within the buried contact openings 87'. Alternatively, the bit lines 81 and the bit line plugs 77 may be covered by the bit line spacers 85 and the bit line plug spacers 75.

Figure 12:
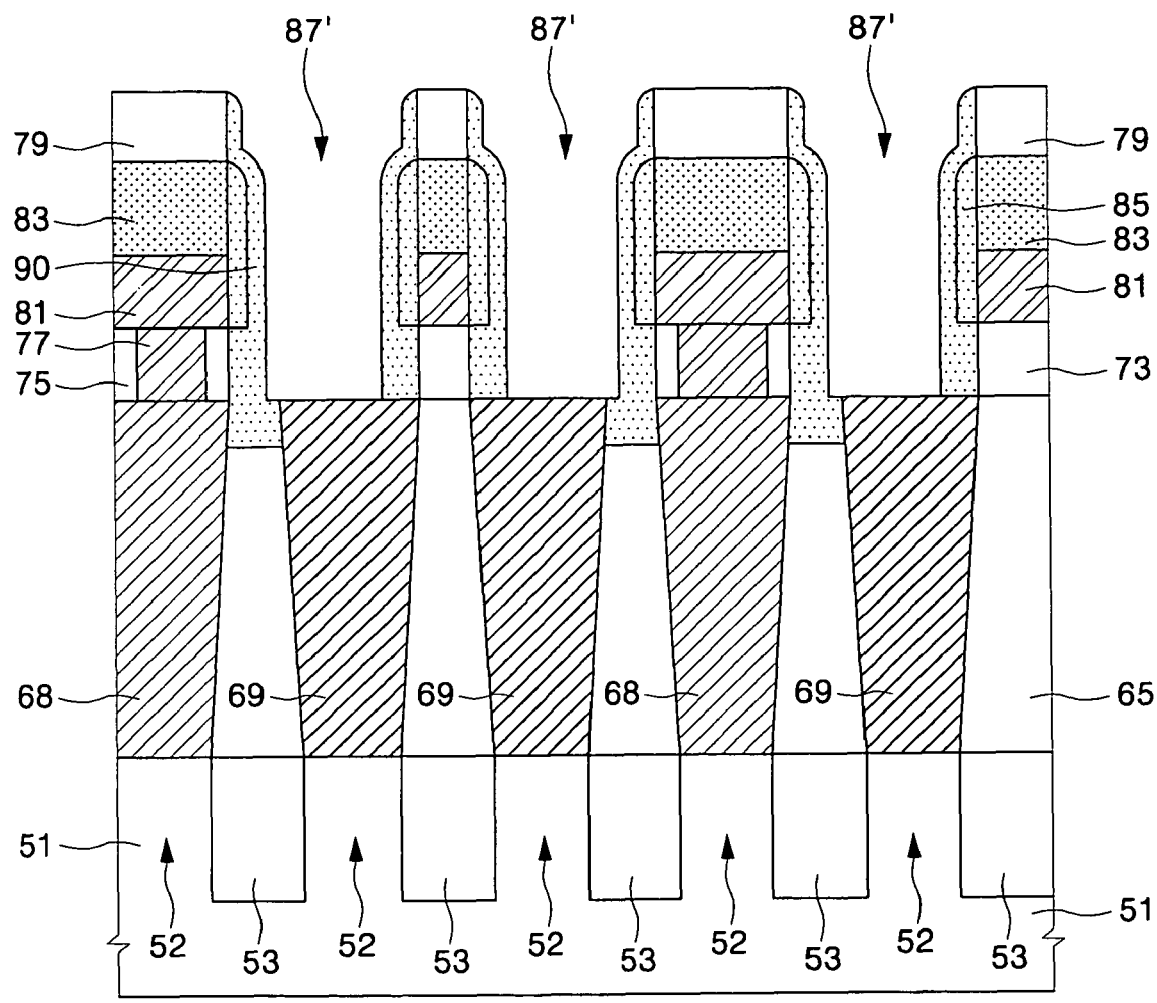

Referring to FIGS. 6, 11 and 12, a buried contact insulating layer is formed to conformably cover the insides of the buried contact openings 87' and a top surface of the upper inter-level dielectric layer 79. The buried contact insulating layer is preferably formed of an insulating layer which can be used without requiring an oxidizing gas such as oxygen gas. This is because the storage landing pads can be oxidized when the oxygen gas is used while the insulating layer for forming the buried contact insulating layer is formed. For example, the buried contact insulating layer may be formed of an insulating layer such as a silicon oxide layer, a silicon nitride layer, or a silicon oxynitride layer. In addition, the buried contact insulating layer is preferably formed to a thickness enough to fill an etched region of the lower inter-level dielectric layer 65. For example, the buried contact insulating layer may be formed to a thickness of 5 nm to 50 nm. The buried contact insulating layer is anisotropically etched to expose top surfaces of the storage landing pads 69. While the top surfaces of the storage landing pads 69 are exposed, sidewalls of the storage landing pads 69 may also be partially exposed. In addition, while the top surfaces of the storage landing pads 69 are exposed, buried contact spacers 90 are formed on inner walls of the buried contact openings 87'.

Consequently, the buried contact spacers 90 cover inner walls of the buried contact openings 87'. That is, the exposed partial regions of the bit line landing pads 68, the exposed sidewalls of the bit lines 81, and the exposed sidewalls of the bit line plugs 77 are covered by the buried contact spacers 90. When the bit line spacers 85 and the bit line plug spacers 75 are formed on the sidewalls of the bit lines 81 and the sidewalls of the bit line plugs 77, the buried contact spacers 90 may cover the bit line spacers 85 and the bit line plug spacers 75. In addition, the etched region of the lower inter-level dielectric layer 65 may be covered by the buried contact spacers 90.

Referring to FIGS. 13, 14, 15 and 28, a buried contact conductive layer is formed on the semiconductor substrate 51 having the buried contact spacers 90. The buried contact conductive layer completely fills the buried contact openings 87' and covers the upper inter-level dielectric layer 79. The buried contact conductive layer may be formed of a polysilicon layer. In addition, the buried contact conductive layer may be formed of a barrier metal layer and a metal layer which are sequentially stacked. The barrier metal layer may be formed of a titanium nitride layer, and the metal layer may be formed of a tungsten layer (W). In addition, the buried contact conductive layer may be formed of the metal layer only.

The buried contact conductive layer is planarized to form buried contact plugs 93. The process of planarizing the buried contact conductive layer may employ a CMP process using the upper inter-level dielectric layer 79 as a stopper. Alternatively, the process of planarizing the buried contact conductive layer may use an etchback process.

Consequently, top surfaces of the buried contact plugs 93 are larger than surfaces in contact with the storage landing pad 69 and are eccentric to the storage landing pad 69 when seen in the plan view. In addition, the buried contact plugs 93 are electrically connected to the active regions 52 via the storage landing pads 69. In addition, the buried contact plugs 93 are prevented from being electrically connected to adjacent conductive patterns, i.e. the bit line landing pads 68, the bit lines 81, and the bit line plugs 77 by means of the buried contact spacers 90.

Referring to FIGS. 13, 16 and 17, a storage node 95, a capacitor dielectric layer 97, and a plate node 99 are sequentially stacked on the semiconductor substrate 51 having the buried contact plugs 93. The storage nodes 95 are in contact with the buried contact plugs 93. In this case, the storage nodes 95 are preferably arranged with a predetermined interval in terms of integration density when seen in the plan view. According to embodiments of the invention, top surfaces of the buried contact plugs 93 are larger than their surfaces in contact with the storage landing pads 69 when seen in the plan view. Accordingly, an alignment margin between the storage nodes 95 and the buried contact plugs 93 can be sufficiently secured.

The storage node 95 can act as a lower electrode of a capacitor, and the plate node 99 can act as an upper electrode of the capacitor. Consequently, a DRAM having the capacitors, the cell transistors, and the buried contact plugs 93 can be fabricated.

Figure 18:
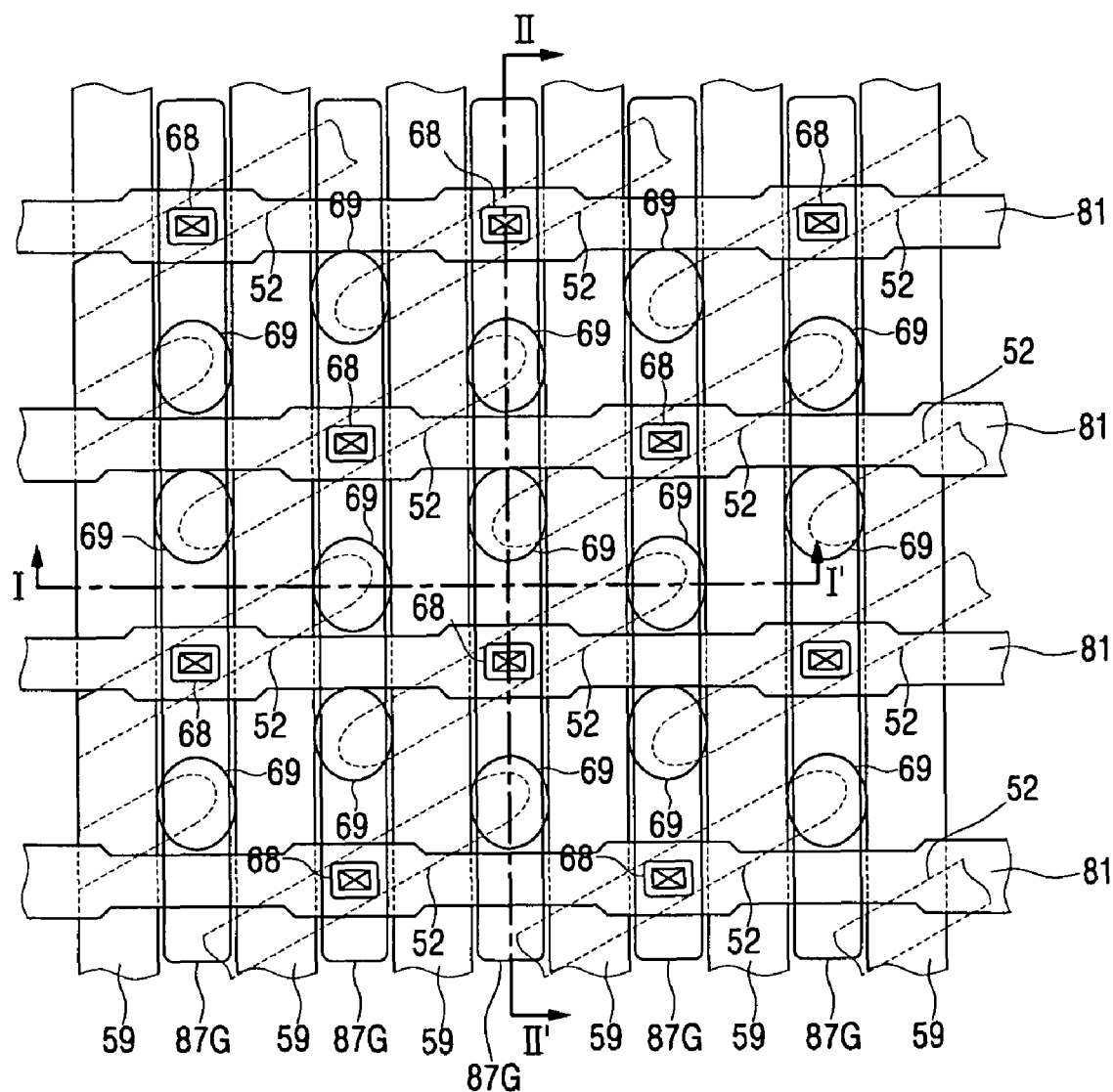
FIGS. 18 to 27 are cross-sectional views and plan views illustrating a method of fabricating a DRAM in accordance with other exemplary embodiments of the invention.
Figure 19:
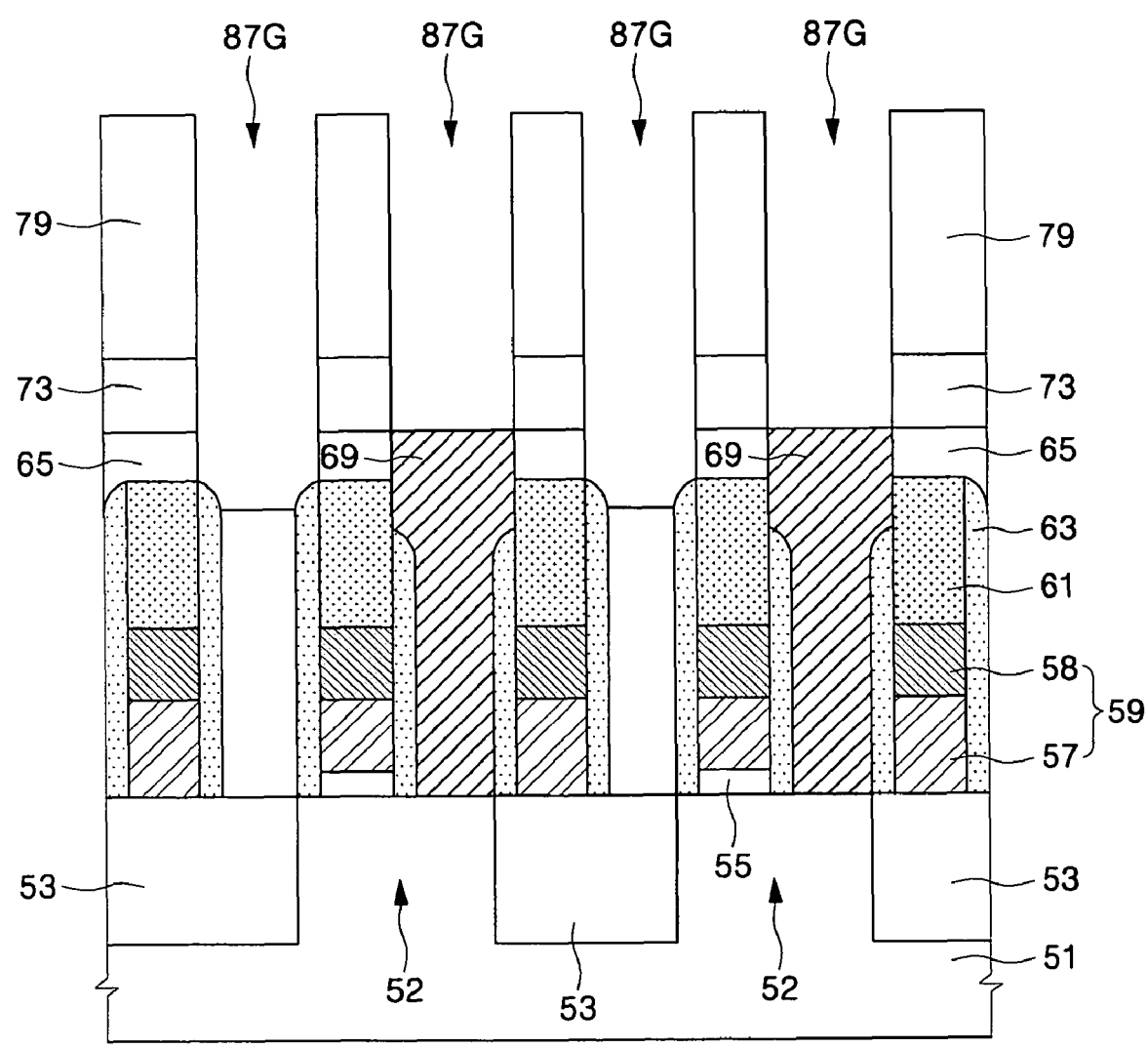
Figure 20:
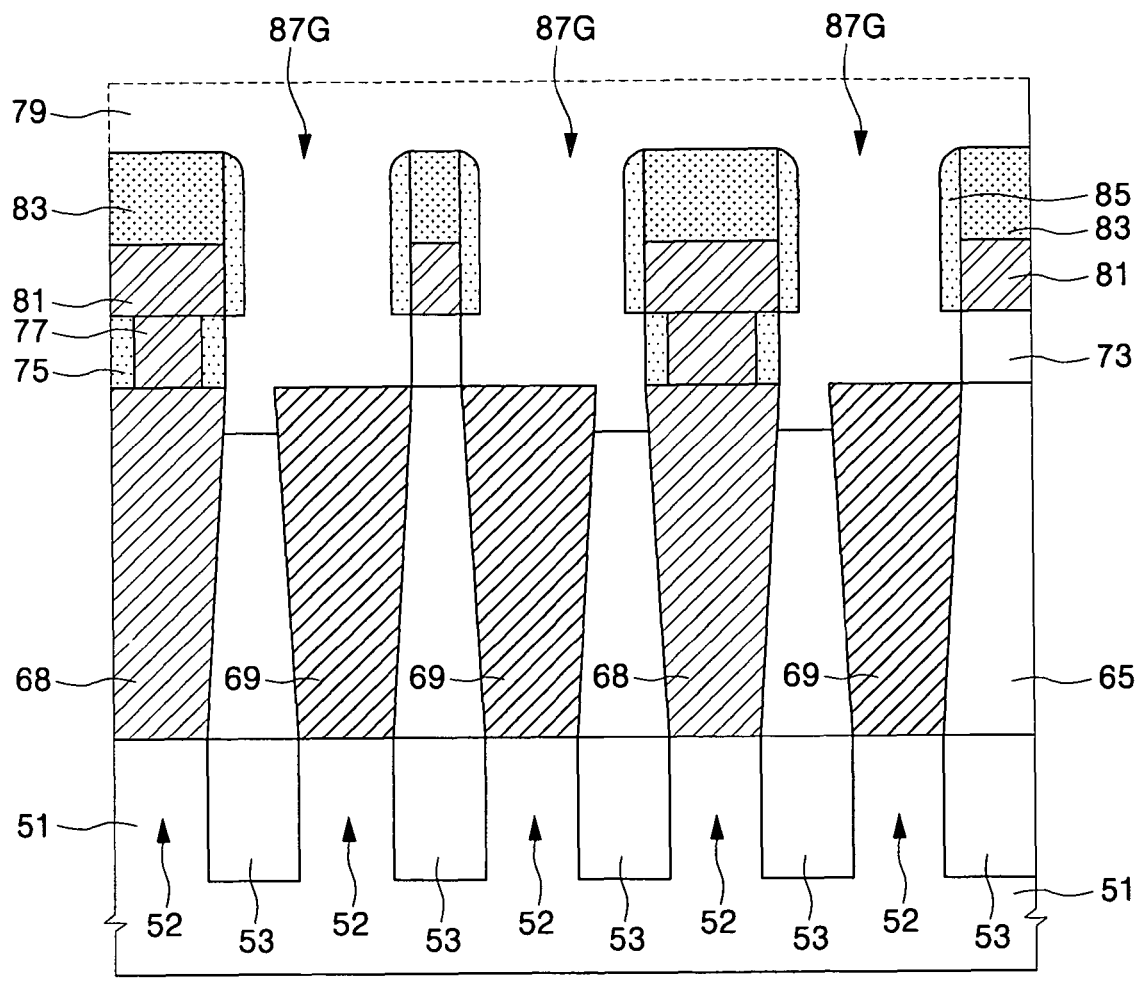
Figure 21:
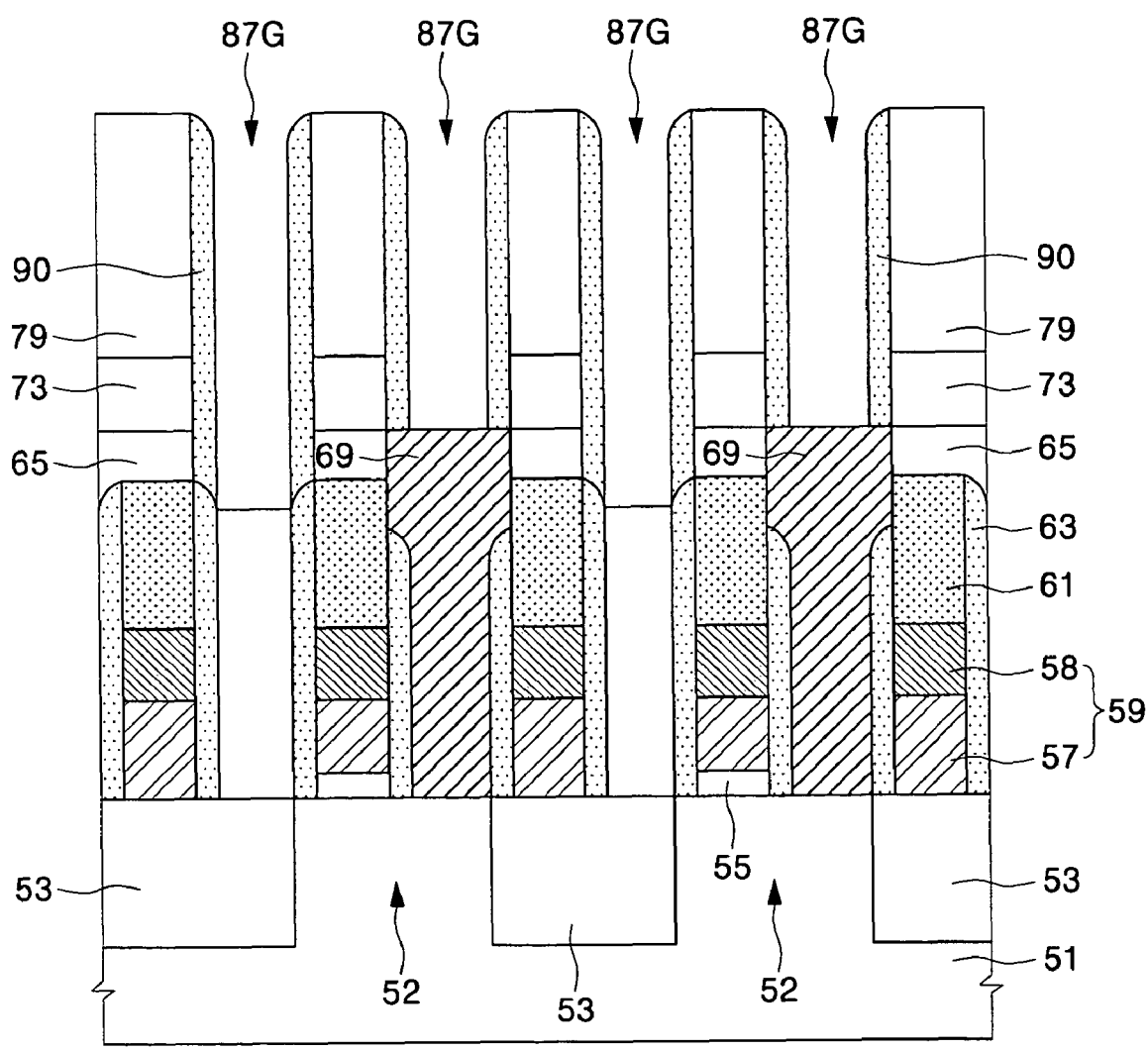
Figure 22:
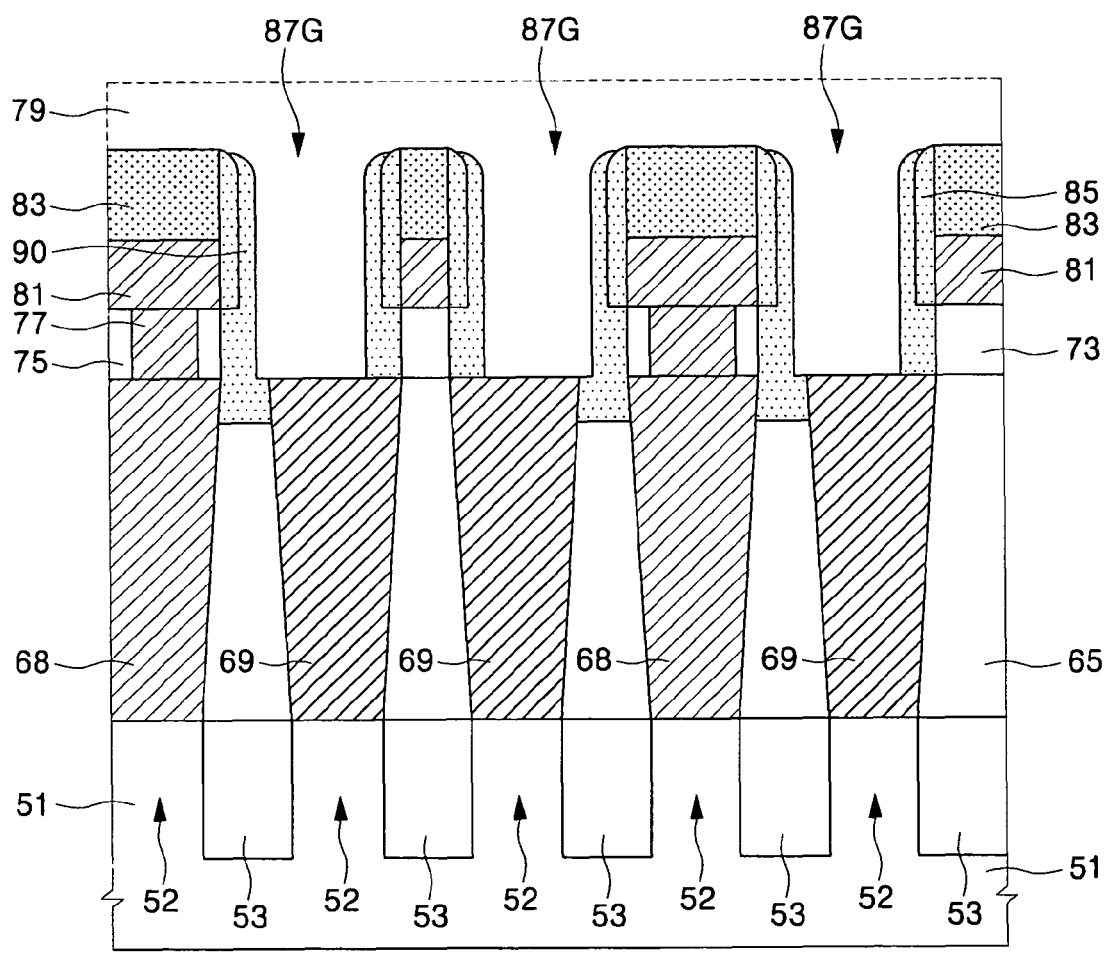
Figure 23:
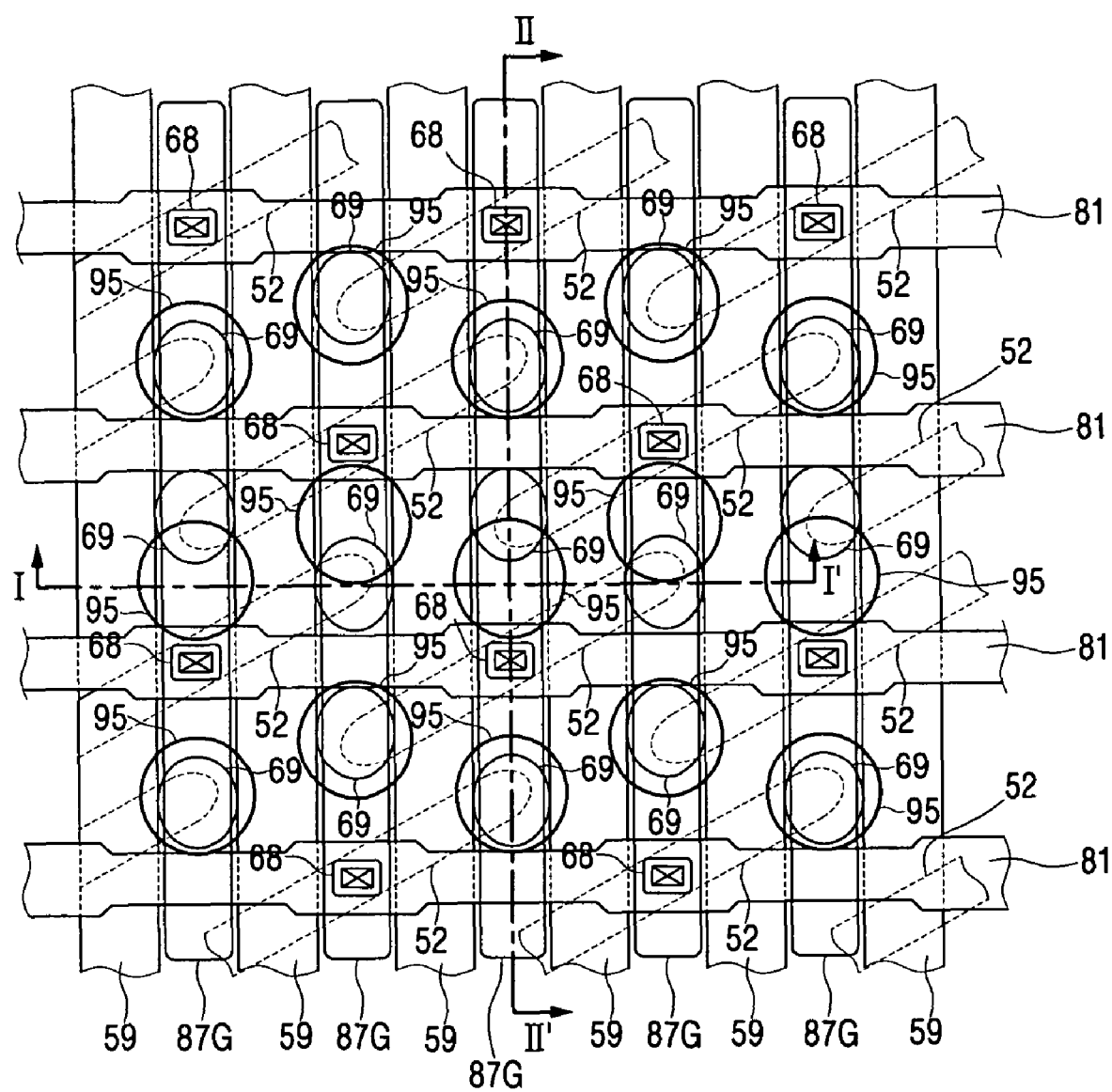
Figure 24:
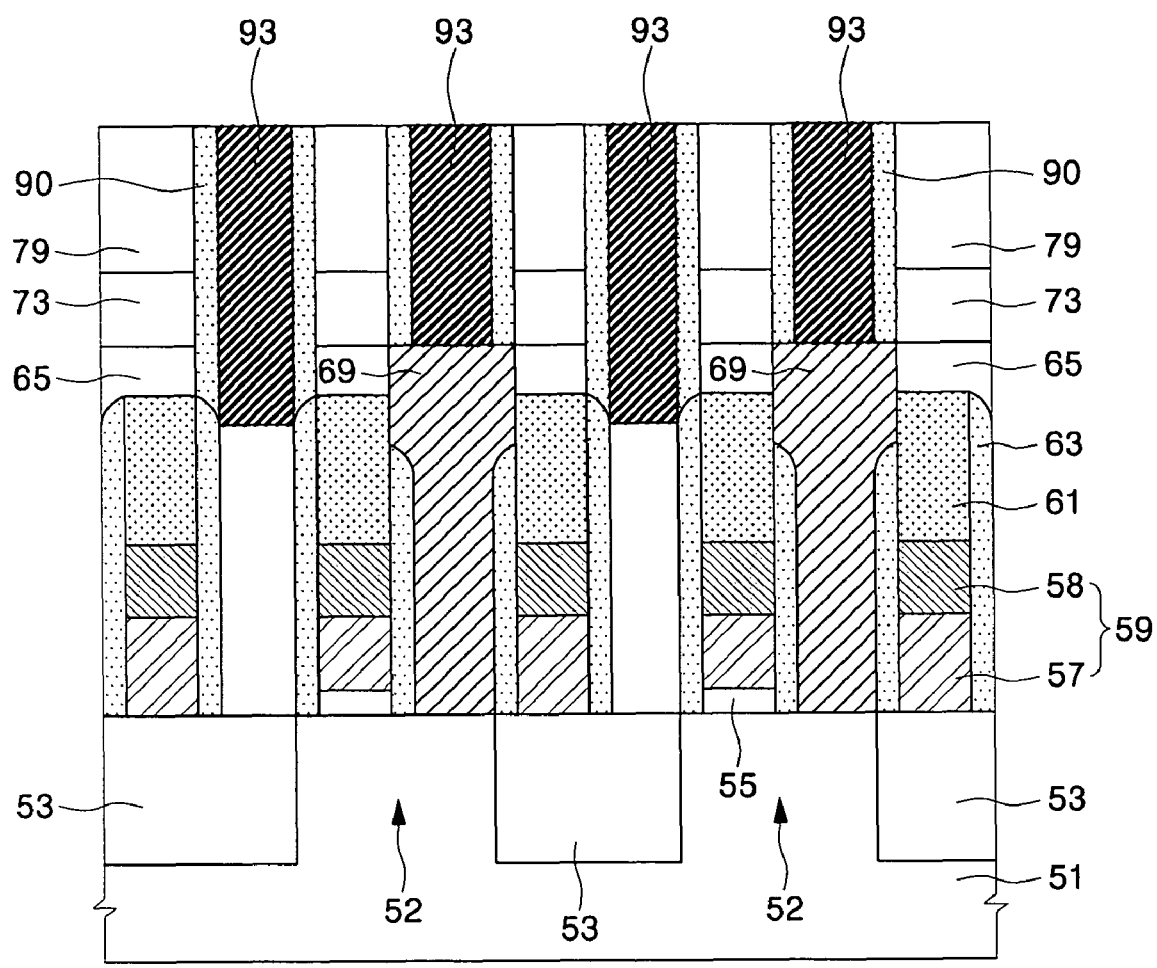
Figure 25:
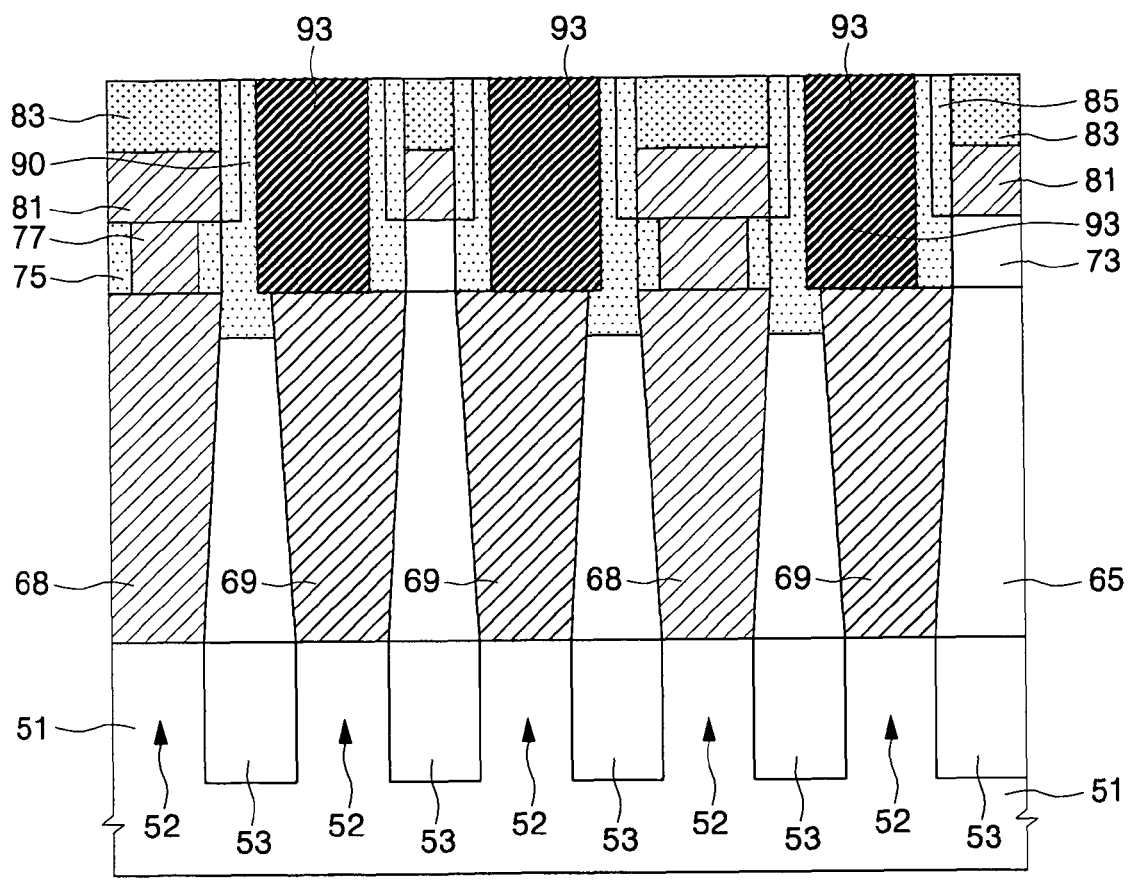
Figure 26:
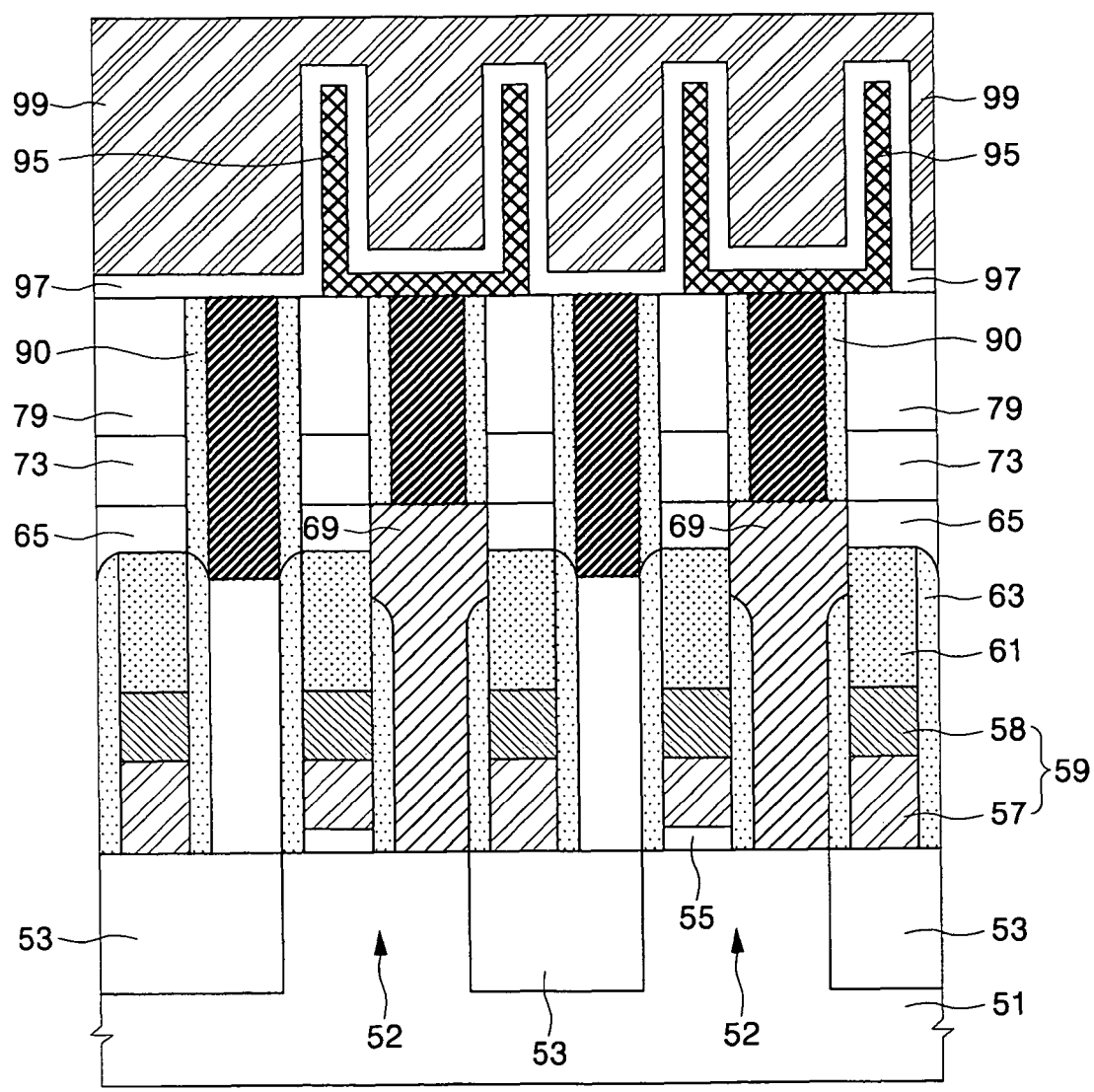
Figure 27:
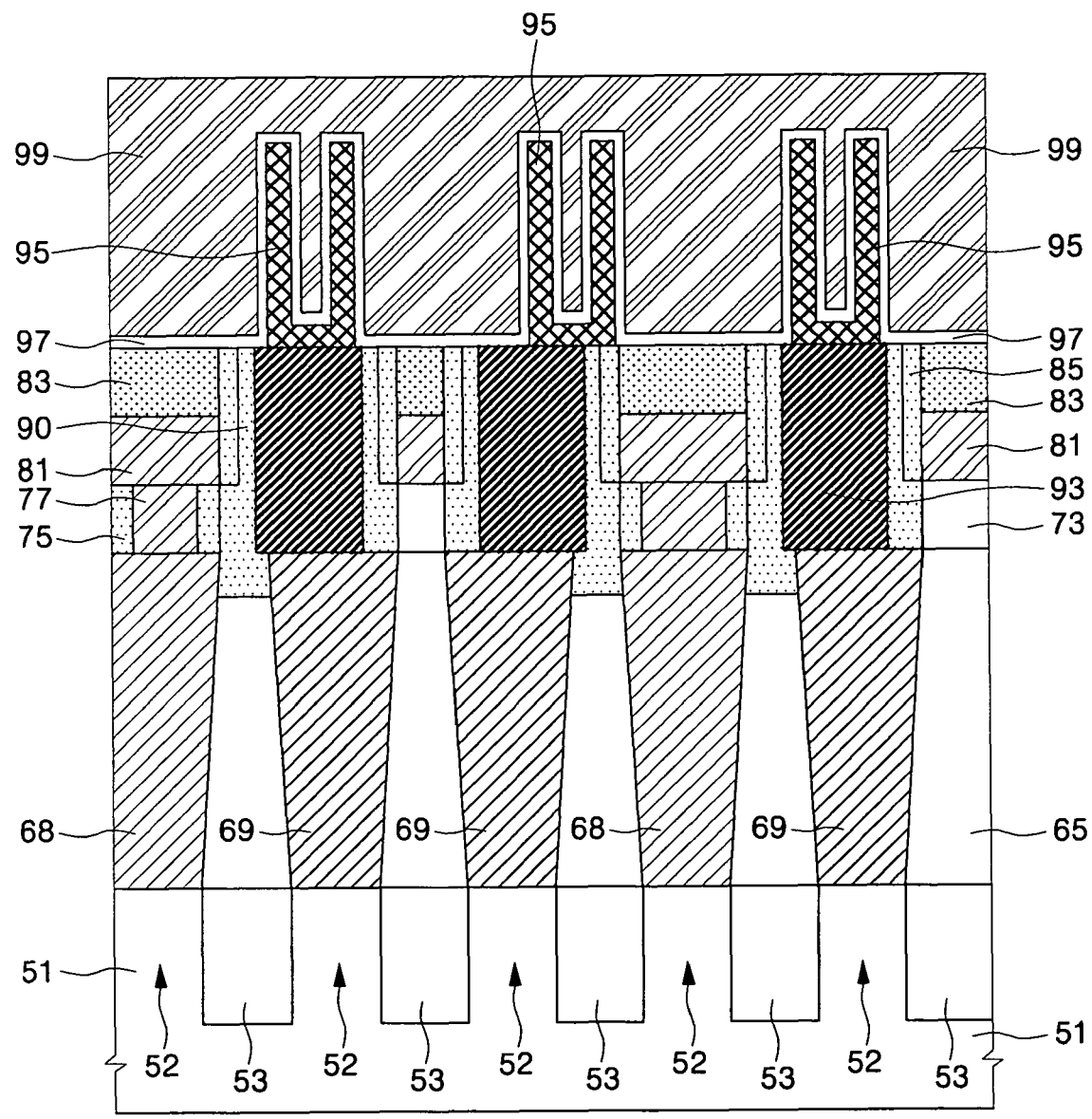
Figure 28:
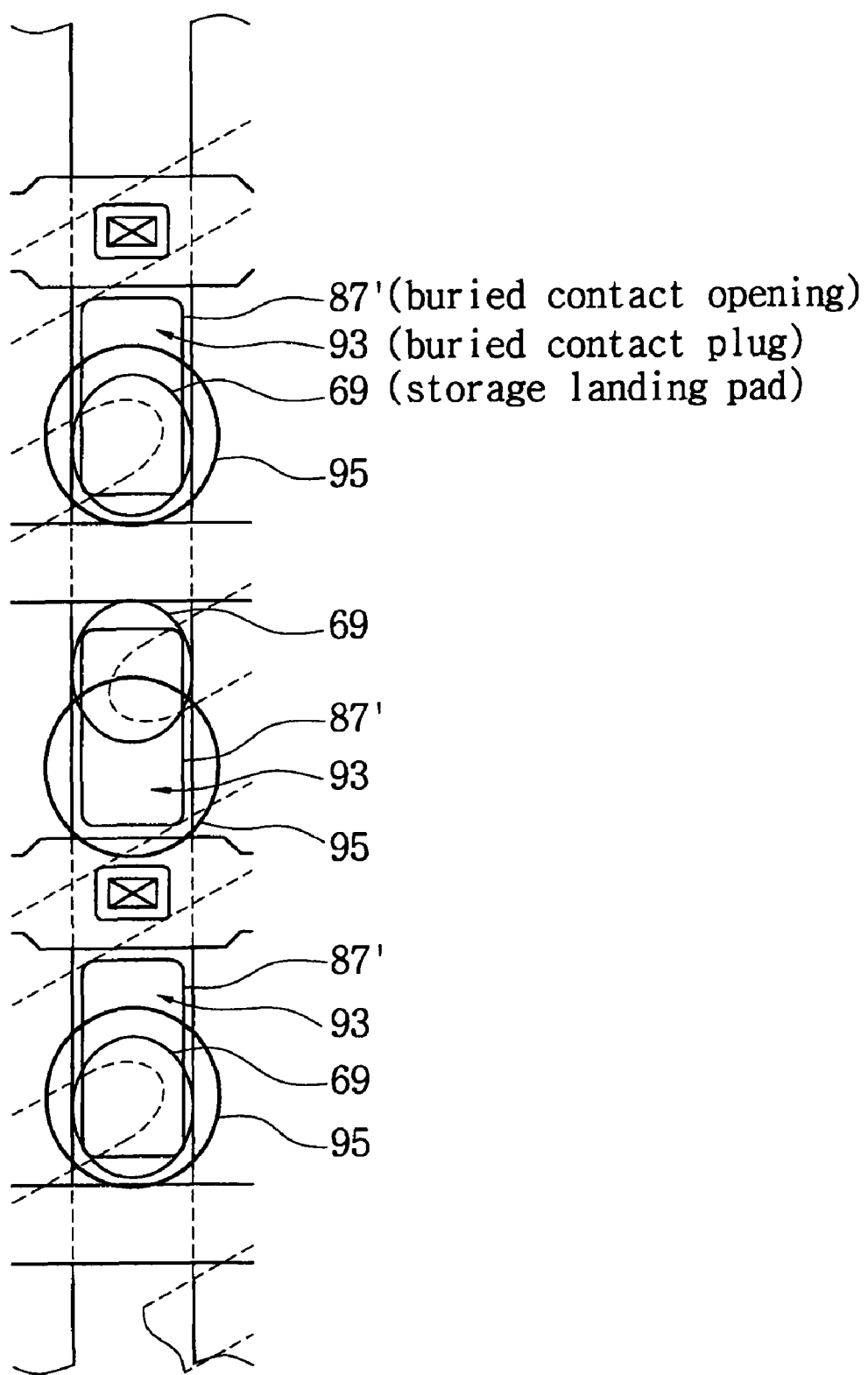
FIG. 28 is an enlarged view of FIG. 13.

FIGS. 18 to 27 are cross-sectional views and plan views illustrating a method of fabricating a DRAM in accordance with other exemplary embodiments of the invention. Specifically, FIG. 18 is a plan view illustrating formation of landing pads, bit lines, and buried contact openings in a method of fabricating the DRAM in accordance with other embodiments of the invention, FIGS. 19 and 21 are cross-sectional views taken along line I-I' of FIG. 18, and FIGS. 20 and 22 are cross-sectional views taken along line II-II' of FIG. 18. FIG. 23 is a plan view illustrating formation of a buried contact plug in a method of fabricating the DRAM in accordance with other embodiments of the invention, FIGS. 24 and 26 are cross-sectional views taken along line I-I' of FIG. 23, and FIGS. 25 and 27 are cross-sectional views taken along line II-II' of FIG. 23.

Referring to FIGS. 18, 19 and 20, the method of fabricating the DRAM according to other embodiments of the invention includes the same constitutional components and formation methods as those described with reference to FIGS. 3 to 5. Hereinafter, a difference therebetween will be described for simplicity of description.

The upper inter-level dielectric layer 79 and the intermediate inter-level dielectric layer 73 are sequentially patterned to form buried contact openings 87G which expose the storage landing pads 69. The buried contact openings 87G may be shaped as grooves which cross over at least two adjacent bit lines 81 as shown in FIG. 18. In this case, the buried contact openings 87G may expose all of partial regions of the storage landing pads 69, partial regions of the capping patterns 83, sidewalls of the bit lines 81 facing each other, and partial regions of the bit line landing pads 68. In addition, while the intermediate inter-level dielectric layer 73 is patterned, the lower inter-level dielectric layer 65 may be partially etched to partially expose sidewalls of the bit line landing pads 68 and the storage landing pads 69. In addition, the bit line plugs 77 may be partially exposed within the buried contact openings 87G. Alternatively, the bit lines 81 and the bit line plugs 77 may be covered by the bit line spacers 85 and the bit line plug spacers 75.

Referring to FIGS. 18, 21 and 22, a buried contact insulating layer is formed to conformably cover the insides of the buried contact openings 87G and a top surface of the upper inter-level dielectric layer 79. The buried contact insulating layer is preferably formed of an insulating layer which can be used without requiring an oxidizing gas such as oxygen gas. This is because the storage landing pads 69 can be oxidized when the oxygen gas is used while the insulating layer for forming the buried contact insulating layer is formed. For example, the buried contact insulating layer may be formed of an insulating layer such as a silicon oxide layer, a silicon nitride layer, or a silicon oxynitride layer. In addition, the buried contact insulating layer is preferably formed to a thickness enough to fill the etched region of the lower inter-level dielectric layer 65. For example, the buried contact insulating layer may be formed to a thickness of 5 nm to 50 nm. The buried contact insulating layer is anisotropically etched to expose top surfaces of the storage landing pads 69. While the top surfaces of the storage landing pads 69 are exposed, sidewalls of the storage landing pads 69 may also be partially exposed. In addition, while the top surfaces of the storage landing pads 69 are exposed, buried contact spacers 90 are formed on sidewalls of the buried contact openings 87G.

Consequently, the buried contact spacers 90 cover inner walls of the buried contact openings 87G. That is, the exposed partial regions of the bit line landing pads 68, the exposed sidewalls of the bit lines 81, and the exposed sidewalls of the bit line plugs 77 are covered by the buried contact spacers 90. When the bit line spacers 85 and the bit line plug spacers 75 are formed on the sidewalls of the bit lines 81 and the sidewalls of the bit line plugs 77, the buried contact spacers 90 may cover the bit line spacers 85 and the bit line plug spacers 75. In addition, the etched region of the lower inter-level dielectric layer 65 may be also covered by the buried contact spacers 90.

Referring to FIGS. 23, 24 and 25, a buried contact conductive layer is formed on the semiconductor substrate 51 having the buried contact spacers 90. The buried contact conductive layer completely fills the buried contact openings 87G and covers the upper inter-level dielectric layer 79. The buried contact conductive layer may be formed of a polysilicon layer. In addition, the buried contact conductive layer may be formed of a barrier metal layer and a metal layer which are sequentially stacked. The barrier metal layer may be formed of a titanium nitride layer, and the metal layer may be formed of a tungsten layer (W). In addition, the buried contact conductive layer may be formed of the metal layer only.

The buried contact conductive layer is planarized to form buried contact plugs 93. The process of planarizing the buried contact conductive layer may employ a CMP process using the capping patterns 83 as a stopper. Alternatively, the process of planarizing the buried contact conductive layer may use an etchback process.

Consequently, top surfaces of the buried contact plugs 93 are larger than their surfaces in contact with the storage landing pad 69 and are eccentric to the storage landing pad 69 when seen in the plan view. In addition, the buried contact plugs 93 are electrically connected to the active regions 52 via the storage landing pads 69. In addition, the buried contact plugs 93 are prevented from being electrically connected to adjacent conductive patterns (i.e. the bit line landing pads 68, the bit lines 81, and the bit line plugs 77) by means of the buried contact spacers 90.

Referring to FIGS. 23, 26 and 27, a storage node 95, a capacitor dielectric layer 97, and a plate node 99 are sequentially stacked on the semiconductor substrate 51 having the buried contact plugs 93. The storage nodes 95 are in contact with the buried contact plugs 93. According to other embodiments of the invention, the top surfaces of the buried contact plugs 93 are larger than the surfaces of the buried contact plugs that are in contact with the storage landing pads 69 when seen in the plan view. Accordingly, an alignment margin between the storage nodes 95 and the buried contact plugs 93 can be sufficiently secured.

According to the embodiments described above, buried contact openings are formed between bit lines parallel to one another, buried contact spacers are formed on inner walls of the buried contact openings, and buried contact plugs filling the buried contact openings are then formed. The top surfaces of the buried contact plugs are larger than their surfaces in contact with the storage landing pads and are eccentric to the storage landing pads when seen in the plan view. Storage nodes are formed on the buried contact plugs. Accordingly, an alignment margin between the storage nodes and the buried contact plugs can be sufficiently secured. Consequently, buried contact plugs of the semiconductor device, which can prevent the contact plug from being electrically connected to adjacent conductive patterns, can be formed without the process of forming intermediate pads.

The invention may be practiced in many ways. What follows are exemplary, non-limiting descriptions of some embodiments of the invention.

According to some embodiments, a method of fabricating a contact plug of a semiconductor device includes forming a lower inter-level dielectric layer on a semiconductor substrate. Bit line landing pads and storage landing pads penetrating the lower inter-level dielectric layer are formed. An intermediate inter-level dielectric layer is formed to cover the lower inter-level dielectric layer, the bit line landing pads, and the storage landing pads. An upper inter-level dielectric layer is formed on a surface of the semiconductor substrate having the intermediate inter-level dielectric layer. The upper inter-level dielectric layer and the intermediate inter-level dielectric layer are partially removed to form buried contact openings which expose at least some parts of the lower inter-level dielectric layer and the storage landing pads. Buried contact spacers are formed on inner walls of the buried contact openings. Buried contact plugs are formed to fill the buried contact openings. The buried contact plugs have top surfaces that are larger than the surfaces that are in contact with the storage landing pads. The top surfaces of the buried contact plugs are also eccentric to the storage landing pads when seen in a plan view.

According to some embodiments, after the intermediate inter-level dielectric layer is formed, the intermediate inter-level dielectric layer may be patterned to form bit line contact holes exposing the bit line landing pads. A bit line plug spacer may be formed on an inner wall of the bit line contact hole. The bit line plug spacer is preferably formed of an insulating layer having an etching selectivity ratio with respect to the intermediate inter-level dielectric-layer. For example, when the intermediate inter-level dielectric layer is a silicon oxide layer, the bit line plug spacer may be formed of a nitride layer. A bit line plug filling the bit line contact holes, bit lines and capping patterns sequentially stacked and crossing over the bit line plug may be formed. The capping pattern may be formed of a nitride layer. Bit line spacers may be formed on sidewalls of the bit line. The bit line spacer may be formed of a nitride layer.

According to some embodiments, the buried contact opening may be formed between two adjacent bit lines. In this case, the buried contact opening may be formed in a rectangular or elliptical shape and may be eccentric to the storage landing pad when seen in a plan view. Alternatively, the buried contact opening may be formed as a groove crossing over the two adjacent bit lines. The buried contact opening may be formed to expose the entire partial region of the bit line landing pad and the sidewalls of the bit lines facing each other. In this case, the buried contact spacer is preferably formed to cover the exposed partial region of the bit line landing pad and the exposed sidewalls of the bit lines. When the bit line spacers are formed on sidewalls of the bit line, the buried contact opening may be formed to expose the entire partial region of the bit line landing pad and the two bit line spacers facing each other. In this case, the buried contact spacer may be formed to cover the exposed partial region of the bit line landing pad and the exposed sidewalls of the bit lines. The buried contact spacer may be formed of any one material among a silicon oxide layer, a silicon nitride layer, and a silicon oxynitride layer.

According to some embodiments, the buried contact plug may be formed of a polysilicon layer or a metal layer. The metal layer may be formed of a titanium nitride layer and a tungsten layer (W) which are sequentially stacked.

According to some embodiments, a method of fabricating a DRAM includes forming a lower inter-level dielectric layer on a semiconductor substrate. Bit line landing pads and storage landing pads penetrating the lower inter-level dielectric layer are formed. An intermediate inter-level dielectric layer is formed to cover the lower inter-level dielectric layer, the bit line landing pads, and the storage landing pads. The intermediate inter-level dielectric layer is patterned to form bit line contact holes exposing the bit line landing pads. Bit line plugs filling the bit line contact holes, bit lines in contact with the bit line plugs and crossing over the intermediate inter-level dielectric layer, and capping patterns stacked on the bit lines are formed. An upper inter-level dielectric layer is formed on a surface of the semiconductor substrate having the bit lines. The upper inter-level dielectric layer and the intermediate inter-level dielectric layer are-partially removed to form buried contact openings exposing partial regions of the lower inter-level dielectric layer and the storage landing pads. Buried contact spacers are formed on inner walls of the buried contact openings. Buried contact plugs filling the buried contact openings are formed. In this case, top surfaces of the buried contact plugs are larger than their surfaces in contact with the storage landing pads and are eccentric to the storage landing pads when seen in a plan view. Storage nodes are formed on the buried contact plugs.

According to some embodiments, an isolation layer defining active regions may be formed on the semiconductor substrate. Insulated gate electrodes crossing over the active regions may be formed.

According to some embodiments, after the bit line contact hole is formed, a bit line plug spacer may be formed on an inner wall of the bit line contact hole. The bit line plug spacer is preferably formed of an insulating layer having an etching selectivity ratio with respect to the intermediate inter-level dielectric layer. For example, when the intermediate inter-level dielectric layer is a silicon oxide layer, the bit line plug spacer may be formed of a nitride layer.

According to some embodiments, bit line spacers may be formed on sidewalls of the bit line. The bit line spacer may be formed of a nitride layer.

According to some embodiments, the buried contact opening may be formed between two adjacent bit lines. In this case, the buried contact opening may be formed in a rectangular or elliptical shape and may be eccentric to the storage landing pad when seen in a plan view. Alternatively, the buried contact opening may be formed as a groove crossing over at least two adjacent bit lines. The buried contact opening may be formed to expose the entire partial region of the bit line landing pad and the sidewalls of the bit lines facing each other. In this case, the buried contact spacer may be formed to cover the exposed partial region of the bit line landing pad and the exposed sidewalls of the bit lines. When bit line spacers are formed on sidewalls of the bit line, the buried contact opening may be formed to expose the entire partial region of the bit line landing pad and the two bit line spacers facing each other. In this case, the buried contact spacer may be formed to cover the exposed partial region of the bit line landing pad and the bit line spacers. The buried contact spacer may be formed of any one material among a silicon oxide layer, a silicon nitride layer, and a silicon oxynitride layer.

According to some embodiments, the buried contact plug may be formed of a polysilicon layer or a metal layer. The metal layer may be formed of a titanium nitride layer and a tungsten layer (W) which are sequentially stacked.

The invention is not limited to the above-described embodiments but can be modified in various ways within the spirit of the invention. For example, the invention can be applied to a non-volatile memory device having buried contact plugs and a method of fabricating the same.

The invention claimed is:

1. A method of fabricating a contact plug of a semiconductor device, the method comprising:
    forming a lower dielectric layer on a semiconductor substrate;
    forming a bit line landing pad and a storage landing pad that penetrate the lower dielectric layer to physically contact the semiconductor substrate;
    covering the lower dielectric layer, the bit line landing pad, and the storage landing pad with a middle dielectric layer;
    forming an upper dielectric layer on the middle dielectric layer;
    partially removing the upper dielectric layer, the middle dielectric layer, and the lower dielectric layer to form a buried contact opening, the buried contact opening exposing a portion of the lower dielectric layer, a portion of the storage landing pad, and a portion of the bit line landing pad;
    forming a buried contact spacer on a sidewall exposed by the buried contact opening; and
    filling the buried contact opening with a buried contact plug that physically contacts the storage landing pad, a top surface of the buried contact plug larger than a surface of the buried contact plug that is in contact with the storage landing pad, the top surface of the buried contact plug eccentric to the storage landing pad when seen in a plan view, wherein a bottom of the buried contact opening is lower than a top surface of the storage landing pad.

2. The method of claim 1, further comprising:
    patterning the middle dielectric layer to form a bit line contact hole that exposes the bit line landing pad;
    filling the bit line contact hole with a bit line plug;
    forming a bit line in contact with the bit line plug, the bit line disposed directly over and overlapping the bit line plug; and
    forming a capping pattern on the bit line, a bottom of the capping pattern disposed in contact with a top of the bit line.

3. The method of claim 1, wherein forming the buried contact spacer comprises forming one selected from the group consisting of a silicon oxide layer, a silicon nitride layer, and a silicon oxynitride layer.

4. The method of claim 1, wherein filling the buried contact opening with the buried contact plug comprises filling the buried contact opening with a polysilicon layer.

5. The method of claim 1, wherein filling the buried contact opening with the buried contact plug comprises filling the buried contact opening with a metal layer, the metal layer comprising a titanium nitride (TiN) layer and a tungsten layer (W) that are sequentially stacked.

6. The method of claim 1, wherein the buried contact spacer is disposed directly on an outer sidewall of the storage landing pad.

7. The method of claim 1, further comprising, after filling the buried contact opening with the buried contact plug, forming a storage node on the buried contact plug.

8. The method of claim 1, wherein the top surface of the buried contact plug and a top surface of the upper dielectric layer are substantially the same level.

9. The method of claim 1, wherein top surfaces of the lower dielectric layer, the bit line landing pad and the storage landing pad are substantially the same level.

10. The method of claim 2, further comprising, before filling the bit line contact hole with the bit line plug, forming a bit line plug spacer on an inner wall of the bit line contact hole.

11. The method of claim 2, wherein forming the capping pattern comprises forming a nitride layer on the bit line.

12. The method of claim 2, further comprising forming a bit line spacer on a sidewall of the bit line.

13. The method of claim 2, the buried contact opening formed between the bit line and an adjacent bit line, formed in a rectangular or elliptical shape, and eccentric to the storage landing pad when seen in a plan view.

14. The method of claim 2, wherein the buried contact opening has a groove shape and is formed to cross over the bit line and an adjacent bit line.

15. The method of claim 2, the buried contact opening formed to expose the bit line spacer, and to expose another bit line spacer disposed on an adjacent bit line.

16. The method of claim 10, wherein forming the bit line plug spacer comprises forming the bit line plug spacer with an insulating layer having an etch selectivity with respect to the middle dielectric layer.

17. The method of claim 16, wherein the insulating layer comprises a nitride layer.

18. The method of claim 12, wherein forming the bit line spacer comprises forming a nitride layer.

19. The method of claim 12, wherein the buried contact opening is formed to expose an entire upper surface of the storage landing pad, to expose the bit line spacer, and to expose another bit line spacer disposed on an adjacent bit line.

20. The method of claim 19, wherein the buried contact spacer is formed to cover the bit line spacers and the portion of the bit line landing pad.

21. The method of claim 15, the buried contact spacer formed to cover the portion of the bit line landing pad, the bit line spacer, and the another bit line spacer.

22. A method comprising:
    forming a lower dielectric layer on a semiconductor substrate;
    forming a bit line landing pad and a storage landing pad that penetrate the lower dielectric layer to contact the semiconductor substrate;
    covering the lower dielectric layer, the bit line landing pad, and the storage landing pad with an intermediate dielectric layer;
    forming an upper dielectric layer on the intermediate dielectric layer;
    partially removing the upper dielectric layer and the intermediate dielectric layer to form a buried contact opening that exposes the storage landing pad, a portion of the lower dielectric layer, and a portion of the bit line landing pad;
    forming a buried contact spacer on an inner wall of the buried contact opening; and
    filling the buried contact opening with a buried contact plug, a top surface of the buried contact plug larger than a surface of the buried contact plug that is in contact with the storage landing pad, the top surface of the buried contact plug eccentric in relation to the storage landing pad.

23. The method of claim 22, in which partially removing the upper dielectric layer and the intermediate dielectric layer to form the buried contact opening comprises partially removing the lower dielectric layer.

24. The method of claim 22, wherein a bottom of the buried contact opening is lower than a top surface of the storage landing pad.

* * * * *